(12) United States Patent
Miao et al.

(10) Patent No.: US 11,908,937 B2
(45) Date of Patent: Feb. 20, 2024

(54) VERTICAL TRANSPORT FIELD-EFFECT TRANSISTOR WITH RING-SHAPED WRAP-AROUND CONTACT

(71) Applicant: International Business Machines Corporation, Armonk, NY (US)

(72) Inventors: Xin Miao, San Jose, CA (US); Kangguo Cheng, Schenectady, NY (US); Chen Zhang, Guilderland, NY (US); Wenyu Xu, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 17/376,752

(22) Filed: Jul. 15, 2021

(65) Prior Publication Data

US 2023/0013383 A1 Jan. 19, 2023

(51) Int. Cl.
*H01L 29/78* (2006.01)
*H01L 29/66* (2006.01)
*H10B 10/00* (2023.01)

(52) U.S. Cl.
CPC .... *H01L 29/7846* (2013.01); *H01L 29/66553* (2013.01); *H01L 29/785* (2013.01); *H01L 2029/7858* (2013.01); *H10B 10/12* (2023.02)

(58) Field of Classification Search
CPC ........... H01L 29/7846; H01L 29/66553; H01L 29/785; H01L 2029/7858; H01L 21/823475; H01L 21/823487; H01L 27/088; H01L 21/28518; H01L 21/823871; H01L 21/823885; H01L 23/485; H01L 27/092; H01L 29/41741; H01L 29/66666; H01L 29/66712–66734; H01L 29/7802–7815; H01L 29/7827–7828; H01L 29/78642; H01L 51/057; H10B 10/12
See application file for complete search history.

(56) References Cited

U.S. PATENT DOCUMENTS

| | | | |
|---|---|---|---|
| 9,425,310 B2 | 8/2016 | Yang | |
| 9,735,253 B1 | 8/2017 | Bi | |
| 9,773,913 B1 | 9/2017 | Balakrishnan | |
| 10,103,247 B1 | 10/2018 | Xie | |

(Continued)

FOREIGN PATENT DOCUMENTS

CN 107887440 4/2018

OTHER PUBLICATIONS

National Intellectual Property Administration, PRC(ISA/CN), Combined Search Report and Written Opinion, PCT/CN2022/097812, 9 pages total, dated Jul. 27, 2022.

*Primary Examiner* — Cuong B Nguyen
(74) *Attorney, Agent, or Firm* — Samuel Waldbaum; Otterstedt & Kammer PLLC

(57) ABSTRACT

Vertical transport field-effect transistors are formed on active regions wherein the active regions each include a wrap-around metal silicide contact on vertically extending side walls of the active region. Such wrap-around contacts form self-aligned and reliable strapping for SRAM bottom nFET and pFET source/drain regions. Buried contacts of SRAM cells may be used to strap the wrap-around metal silicide contacts with the gates of inverters thereof. Wrap-around metal silicide contacts provide additional contacts for logic FETs and reduce parasitic bottom source/drain resistance.

7 Claims, 15 Drawing Sheets

(56) References Cited

U.S. PATENT DOCUMENTS

| | | |
|---|---|---|
| 10,192,867 B1 | 1/2019 | Frougier |
| 10,483,361 B1 | 11/2019 | Lee |
| 10,665,590 B2 | 5/2020 | Xie |
| 10,923,590 B2 | 2/2021 | Cheng |
| 2018/0006118 A1 | 1/2018 | Mallela |
| 2018/0122913 A1 | 5/2018 | Xi |
| 2019/0206878 A1* | 7/2019 | Chanemougame ............... H01L 29/66666 |
| 2019/0287865 A1 | 9/2019 | Zhu et al. |
| 2020/0119191 A1* | 4/2020 | Li ................ H01L 29/78642 |
| 2020/0343241 A1 | 10/2020 | Wu |

* cited by examiner

US 11,908,937 B2

VERTICAL TRANSPORT FIELD-EFFECT TRANSISTOR WITH RING-SHAPED WRAP-AROUND CONTACT

BACKGROUND

The present invention relates generally to the electrical, electronic and computer arts and, more particularly, to semiconductor structures including vertical transistor and the fabrication of such structures.

Metal oxide semiconductor field-effect transistors (MOSFETs) include gate electrodes that are electrically insulated from operatively associated semiconductor channels by thin layers of dielectric material. MOSFETs having n-doped source and drain regions employ electrons as the primary current carriers while those having p-doped source and drain regions use holes as primary current carriers. Vertical transport field-effect transistors (VTFETs) have configurations wherein the current between the drain and source regions is substantially normal to the surface of the die. A vertical transport field-effect transistor may, for example, include a semiconductor pillar or fin having top and bottom regions comprising source/drain regions, the portion of the pillar between the source/drain regions defining a channel region.

Vertical transport FETs (VTFETs) are a promising alternative to standard lateral FET structures due to potential benefits, among others, in terms of reduced circuit footprint. A logic circuit comprising VTFETs can be referred to as a "vertical transport logic gate." VTFETs can potentially provide electronic devices comprising logic circuits with improved circuit density. Such logic circuits can be characterized by a lower-number CPP (contacted gate pitch) versus comparable logic circuits comprising lateral FET layouts. Minimum wiring pitch can also be relevant for realizing denser vertical FET layouts.

Static random access memory (SRAM) cells are employed in microprocessor circuits and comprise arrangements of transistors. SRAM semiconductor memory uses bi-stable latching circuitry to store each bit of binary data (e.g., "0" or "1") and does not require periodic refreshing to maintain its data if left undisturbed. However, it is typically still volatile in that data is lost when power is removed. A conventional SRAM is composed of an array of individual SRAM bit cells, where each bit cell stores a single bit of data accessed by a pair of complementary bit lines known as bit line true (BLT) and bit line complementary (BLC). Each bit cell is in turn composed of a number of transistors which together store the bit itself and control access to it.

BRIEF SUMMARY

Monolithic semiconductor structures including one or more vertical transport FETs and fabrication of such structures are aspects of inventions disclosed herein.

In one aspect, an exemplary method of forming a structure including vertical transport field-effect transistors includes obtaining a semiconductor structure including a substrate, a cavity within the substrate, and parallel semiconductor fins extending vertically from the substrate. An active region including one or more doped, bottom source/drain regions within the cavity includes a top surface and a peripheral side wall extending downwardly from the top surface thereof. A protective liner is on the top surface of the active region. A trench extends through the protective liner and into the substrate and a first layer of STI dielectric material is within and partially fills the trench. An upper portion of the peripheral side wall of the active region adjoins the trench and extends vertically above the first layer of STI dielectric material. The exemplary method further includes depositing a contact metal layer over the semiconductor structure and contacting the upper portion of the peripheral side wall of the active region, forming a metal silicide layer from the contact metal and the upper portion of the peripheral side wall of the active region, the metal silicide layer wrapping around the active region, removing the protective liner, forming gate stacks on the semiconductor fins, each of the gate stacks including a gate dielectric layer and gate metal, and forming epitaxial top source/drain regions on the semiconductor fins.

A further method of forming a structure including vertical transport field-effect transistors includes obtaining a semiconductor structure including a substrate, a cavity within the substrate, and parallel semiconductor fins extending vertically from the substrate, epitaxially forming an active region including merged bottom source/drain regions within the cavity, the active region including a top surface and a peripheral side wall extending downwardly from the top surface thereof, and forming a metal silicide layer on the peripheral side wall of the active region, the metal silicide layer wrapping around the active region. The method further includes forming a plurality of vertical transport field-effect transistors comprising the merged bottom source/drain regions, the semiconductor fins, gate stacks adjoining the semiconductor fins, and epitaxial top source/drain regions adjoining the semiconductor fins.

In a further aspect, a semiconductor structure includes a semiconductor substrate, vertical transport field-effect transistors extending vertically with respect to the semiconductor substrate, and one or more active regions on the semiconductor substrate. Each of the one or more active regions includes merged, bottom source/drain regions for a plurality of the vertical transport field-effect transistors and a peripheral side wall extending downwardly from a top surface of the merged, bottom source/drain regions and comprising a metal silicide contact wrapping around the merged bottom source/drain regions. Shallow trench isolation regions surround, respectively, each of the one or more active regions.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. Where an actor facilitates an action by other than performing the action, the action is nevertheless performed by some entity or combination of entities.

One or more embodiments or elements thereof can be implemented in the form of a computer program product including a computer readable storage medium with computer usable program code for performing the method steps indicated. Furthermore, one or more embodiments or elements thereof can be implemented in the form of a system (or apparatus) including a memory, and at least one processor that is coupled to the memory and operative to perform exemplary method steps. Yet further, in another aspect, one or more embodiments or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques as disclosed herein can provide substantial beneficial technical effects. By way of example only and without limitation, one or more embodiments may provide one or more of the following advantages:

Operational benefits of VTFETs;

Forms self-aligned and reliable strapping for SRAM p+ and n+ regions;

Forms additional contacts for logic FETs and reduces parasitic bottom source/drain resistance;

Improves drive current of vertical FETs.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

The parasitic resistance of the bottom source/drain region of a vertical logic FET may be much larger than that of the top source/drain region thereof due to the longer path from the channel to the bottom contact. The bottom source/drain region may accordingly limit drive current of such vertical FETs. Vertical FET SRAM cell designs may rely on tunneling current between abutted p-n junctions for electrical strapping or etch gauging to allow contact metal to strap n-type epitaxy with p-type epitaxy. Abutted p-n junctions used to form tunneling diodes may not be reliable for electrical strapping. The strapping of n+ and p+ regions through a buried contact requires isotropic etching to form a trench adjoining such regions and forming a contact within the trench.

In accordance with one or more embodiments of the inventions described herein, vertical FETs are formed with ring-shaped, wrap-around metal silicide regions that extend around the active regions of a structure. Logic FETs formed in such a manner may benefit from reduced parasitic resistance, improved drive current, and allow the formation of additional contacts other than the standard bottom trench contact. In an SRAM cell, the ring-shaped, wrap-around metal silicide regions form self-aligned and reliable strapping for p+ and n+ regions. A buried contact straps ring contact silicide with the gate of an inverter within the cell.

Figure 1:
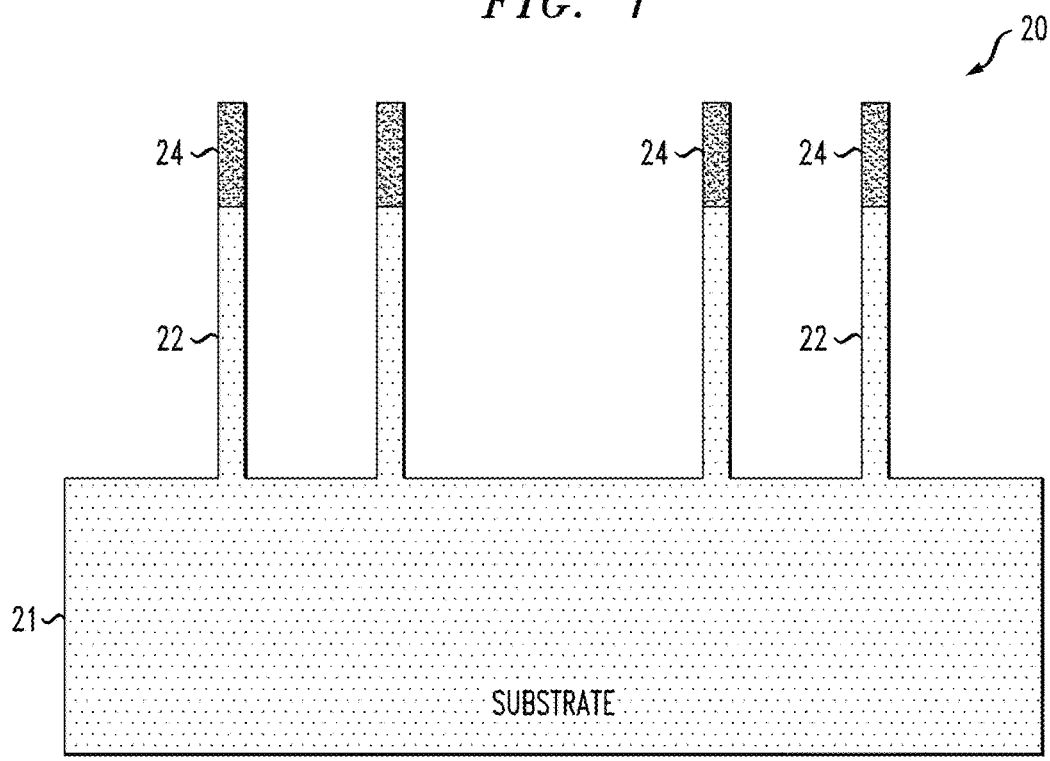
FIG. 1 is a sectional view showing a semiconductor structure following fin formation.

A semiconductor structure 20 including a bulk semiconductor substrate 21 comprised of crystalline silicon and an array of semiconductor fins 22 extending vertically from the substrate is shown in FIG. 1. The substrate may be in the form of a wafer that is essentially undoped, but may contain some impurities. The array of parallel semiconductor fins 22 is formed from the substrate using, for example, a sidewall image transfer process. A hard mask may be deposited over the substrate, including any features thereon, using conventional deposition techniques such as spin-on coating, CVD, plasma-assisted CVD, or other known techniques. The fins 22 are formed beneath portions of the hard mask that remain on the structure following mask patterning. Semiconductor fins 22 extending vertically with respect to the substrate are formed following partial removal of substrate material by an etching process such as a reactive ion etch (RIE). Sacrificial dielectric caps 24 on the top surfaces of the fins 22 are the remaining portions of the hard mask (HM). Fin heights are preferably equal. Fin heights, widths and spacing are further chosen in accordance with manufacturer preferences. Fin heights in some embodiments range between 10-50 nm. The substrate in one exemplary embodiment is a (100) substrate oriented such that the side walls of the mono-crystalline silicon fins 22 are (110) surfaces. The side walls of the fins 22 may not be exactly vertical. Surfaces described as (110) surfaces herein are at least close to being (110) surfaces but may or may not be exactly (110) surfaces. Fin pitch is thirty-six nanometers (36 nm) or less in some exemplary embodiments. The structure 20 may include nFET and pFET regions separated by a trench running perpendicularly to the semiconductor fins 22.

It will be appreciated that the substrate 21 and fins 22 formed therefrom may include one or more semiconductor materials. Non-limiting examples of suitable substrate materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. The semiconductor material chosen for the fins influences the choice of materials for other elements of the structure. Vertical transport devices can alternatively be formed on a semiconductor-on-insulator (SOI) substrate including a buried insulator layer.

Figure 2:
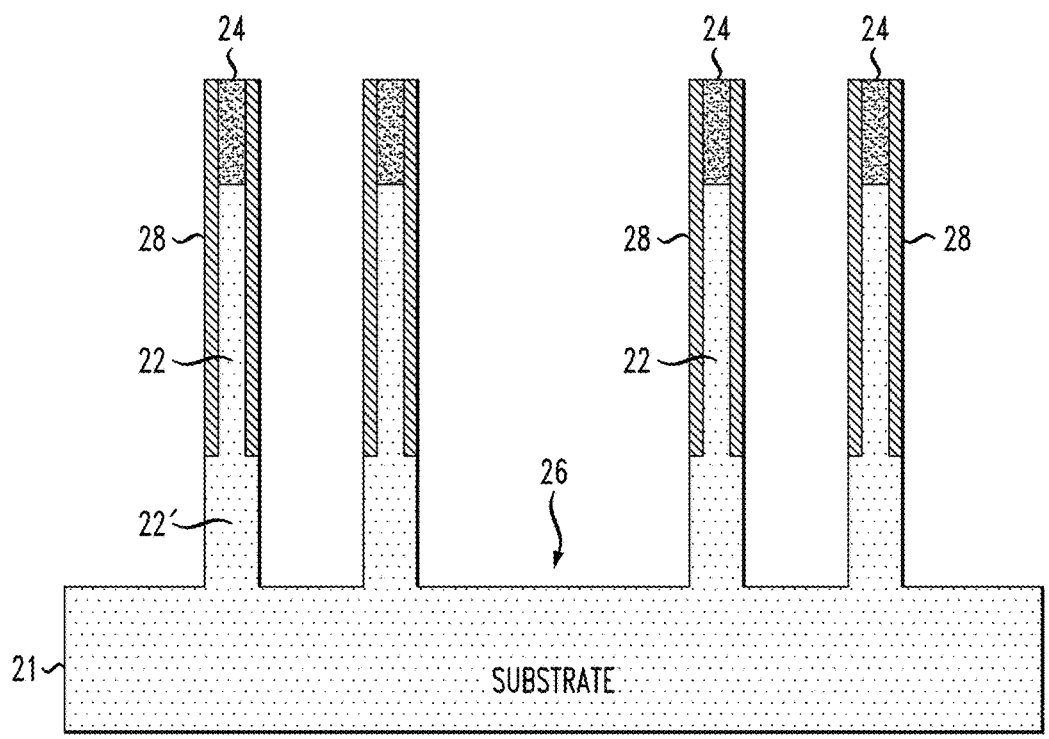
FIG. 2 is a sectional view showing the structure of FIG. 1 following formation of a conformal fin liner and a bottom source/drain cavity.

Once the semiconductor fins 22 are formed and selective fin cutting is completed, a bottom cavity 26 is etched within the substrate 21. The semiconductor fins 22 are protected while the cavity is formed by an etch-resistant liner 28 that adjoins the fin and hard mask sidewalls. FIG. 2 illustrates an exemplary structure following cavity formation.

Figure 3:
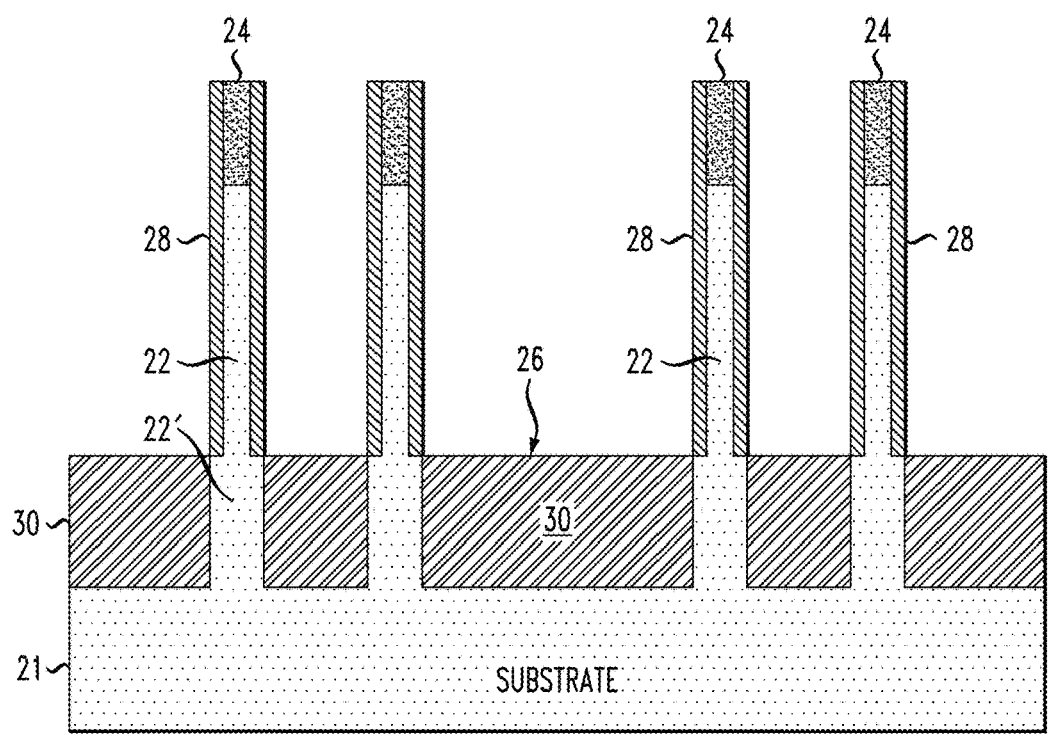
FIG. 3 is a sectional view showing the structure of FIG. 2 following epitaxial deposition of a bottom source/drain layer.

Epitaxial layers for bottom source/drain regions of vertical transport field-effect transistors (VTFETs) are formed after cavity formation and will accordingly be embedded within the substrate 21. The source/drain regions within the nFET regions of a silicon substrate 21 are doped with an n-type dopant such as phosphorus or arsenic that provides n-type conductivity. As used herein, the term "conductivity type" denotes a dopant region being p-type or n-type. As further used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. Examples of n-type dopants, i.e., impurities in a silicon-containing substrate include but are not limited to antimony, arsenic and phosphorous. The dopants incorporated in the source/drain regions in the nFET regions of the substrate 21 may, for example, be phosphorus in a concentration in the range of $1-5\times10^{21}$ cm$^{-3}$ or 2-10 atomic % of phosphorus in Si. Various techniques can be employed to incorporate dopants in semiconductors, including implantation and diffusion. In an exemplary embodiment as illustrated in FIG. 3, a heavily doped source/drain layer 30 can be formed by epitaxial growth on the substrate 21 and the exposed fin base portions 22' beneath the originally formed semiconductor fins 22. The liner 28 on the semiconductor fins 22 is not conducive to epitaxial growth. The source/drain layer 30 within the cavity 26 accordingly does not adjoin the liner 28. The epitaxially grown source/drain layer can be doped in situ.

The epitaxial deposition process may employ the deposition chamber of a chemical vapor deposition type apparatus, such as a low pressure chemical vapor deposition (LPCVD) apparatus. A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, for example epitaxial deposition, that forms the doped layer. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

Figure 4:
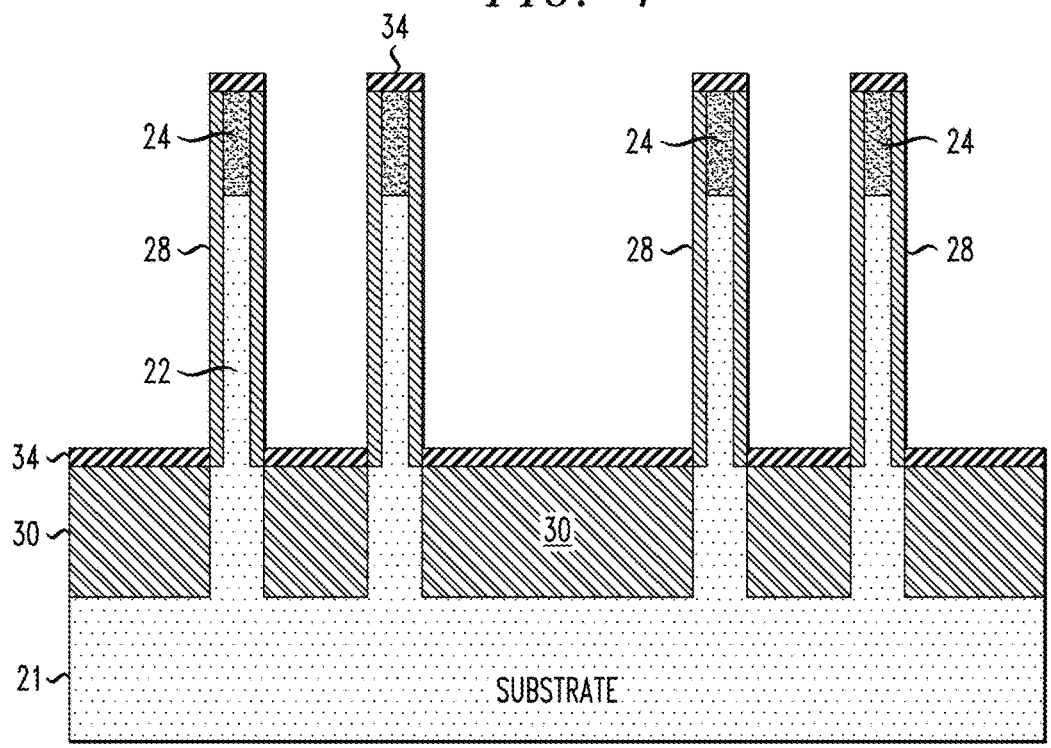
FIG. 4 is a sectional view showing the structure of FIG. 3 following directional deposition of a liner of the fill layer.

Referring to FIG. 4, a protective liner 34 is directionally deposited on the source/drain layer 30 and over the dielectric caps 24 on the semiconductor fins. Gas cluster ion beam (GCIB) deposition and high density plasma (HDP) deposition are among the process that can be employed to form, for example, a silicon oxide protective liner 34. Optionally, isotropic liner etch-back may follow liner deposition. The liner thickness on the source/drain layer 30 may be about six nanometers (6 nm) in exemplary environments.

Figure 5:
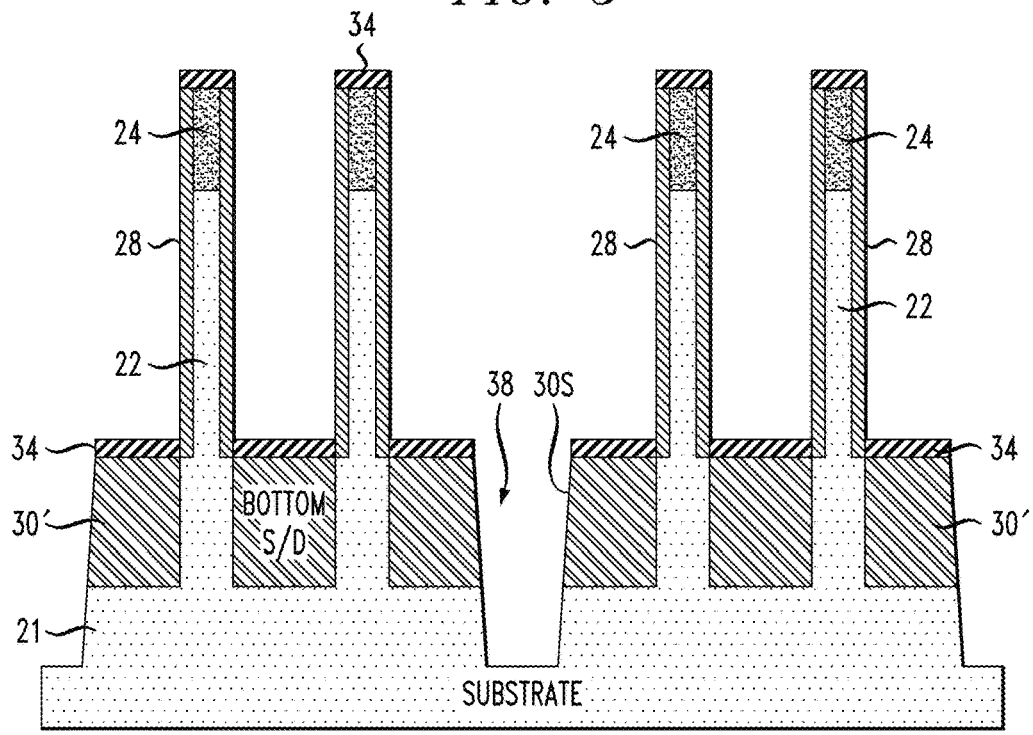
FIG. 5 is a sectional view showing the structure of FIG. 4 following formation of a shallow trench isolation (STI) trench within the structure.

Trenches are formed that extend through the protective liner 34 and the bottom source/drain layer 30 and partially within the semiconductor substrate 21. Such trenches can be formed using, for example, a conventional dry etch chemistry including for example, Cl$_2$, HBR, and O$_2$. As shown in FIG. 5, an exemplary trench 38 having converging sidewalls is formed between sets of semiconductor fins 22. Discrete bottom source/drain regions 30' (active regions) are thereby formed from the source/drain layer 30. Vertically extending sidewalls 30S of the active regions comprised of the bottom source/drain regions 30' are exposed. The trenches 38 are employed to form shallow trench isolation (STI) regions as discussed below and may be referred to as STI trenches. The active regions isolated by the STI regions may include a plurality of VTFETs, as described further below.

Figure 6:
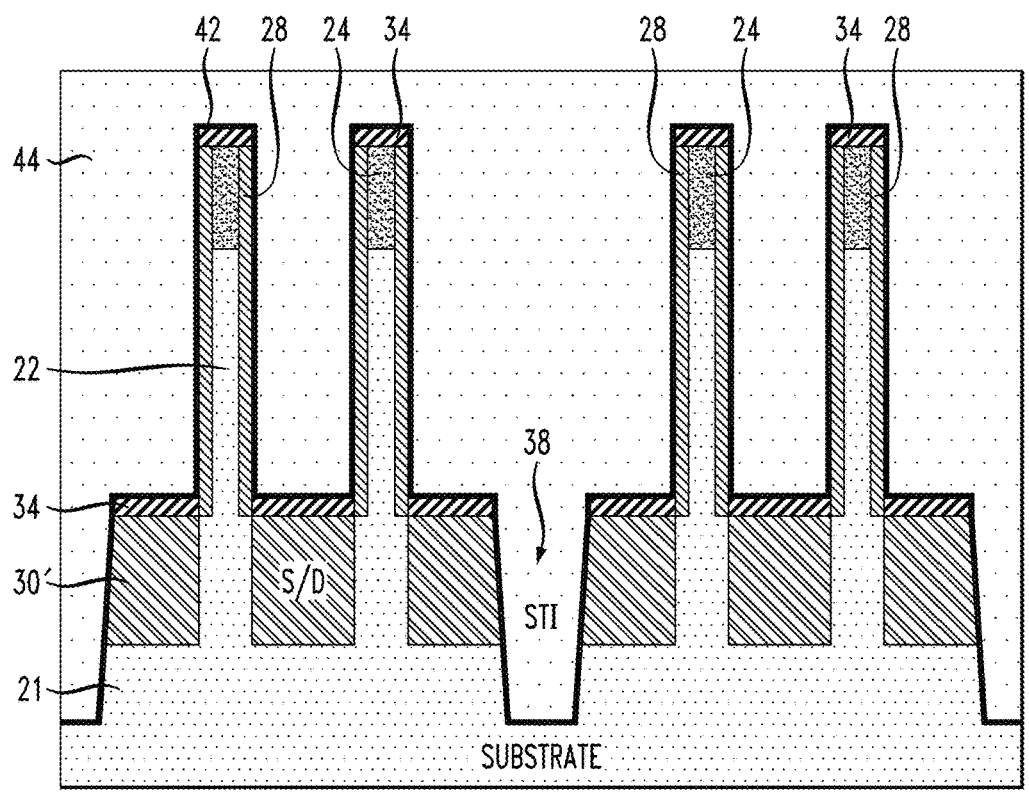
FIG. 6 is a sectional view showing the structure of FIG. 5 following deposition of a dielectric liner and a dielectric fill layer.
Figure 7:
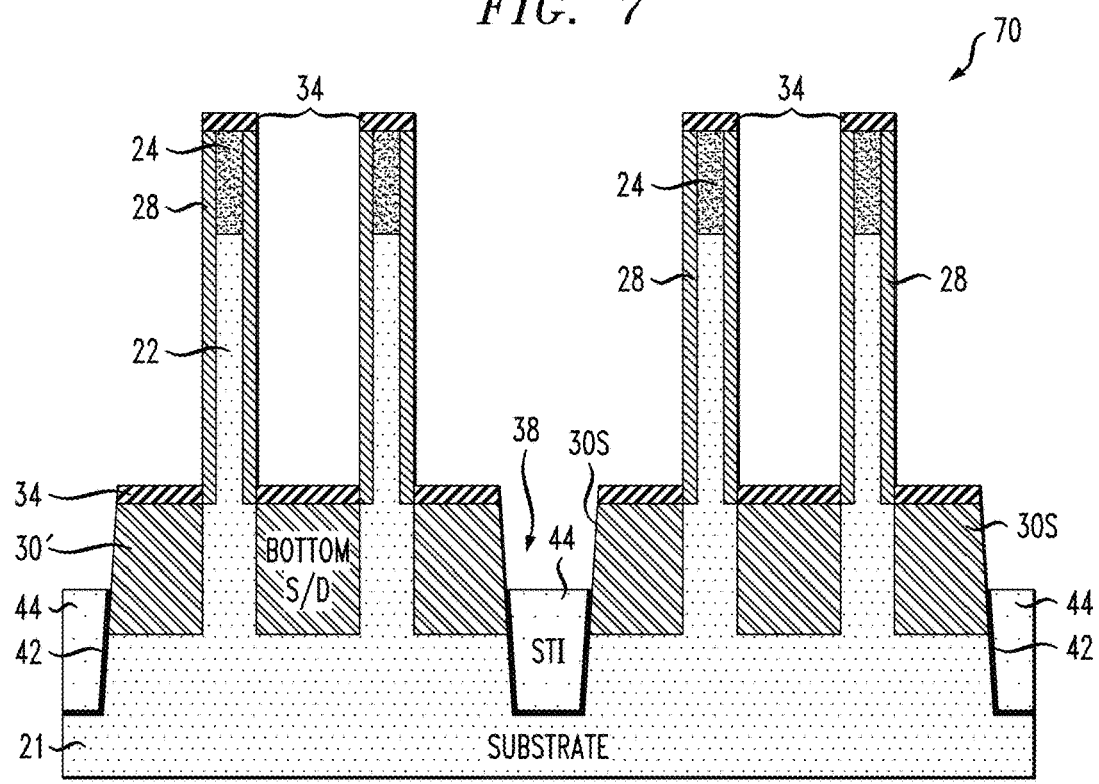
FIG. 7 is a sectional view showing the structure of FIG. 6 following selective recessing of the dielectric fill layer and removal of subsequently exposed portions of the dielectric liner.

A first STI liner 42 is conformally deposited on the resulting structure followed by the deposition of a first STI oxide layer 44 (for example CVD silicon dioxide). The STI liner may be comprised of silicon nitride in some exemplary embodiments. An exemplary structure 60 as schematically illustrated in FIG. 6 may be obtained following deposition of the first STI liner 42 and filling the structure with the STI oxide. A planarization process such as chemical mechanical polish (CMP) can be performed to remove STI oxide above the STI liner 42. The first STI oxide layer 44 is recessed to a level between the top and bottom surfaces of the bottom source/drain regions 30'. In some exemplary embodiments, the STI oxide is recessed by a two-step recess process. In the first step, the STI oxide is recessed by a directional etch process such as reactive ion etch (RIE). The protective liner 34 on top of the bottom S/D can be used for RIE endpoint. In the second step, an isotropic etch such as chemical oxide removal (COR) can be used to further recess the STI oxide. The first RIE step can have a greater etch rate to reduce the process time while the second COR etch has a slower but more precisely controlled etch rate. Alternatively, the STI oxide can be recessed by a single RIE, COR, an aqueous solution containing diluted hydrogen fluoride (DHF), or any other suitable combination of those processes. After STI oxide recess, the exposed STI liner 42 can be removed by any suitable isotropic etch process. The bottom S/D regions are exposed below the top surface of the bottom S/D to a depth ranging from 20 nm to 100 nm, more preferably 30 nm to 50 nm. The exposed portions of the first STI liner 42 are then removed to obtain a structure 70 as schematically illustrated in FIG. 7. In embodiments where the first STI liner is a silicon nitride liner, hot phosphoric acid can be employed to remove the exposed portions thereof. The sidewalls of the source/drain regions 30' above the top surface of the recessed first STI oxide layer 44 are exposed.

Figure 8:
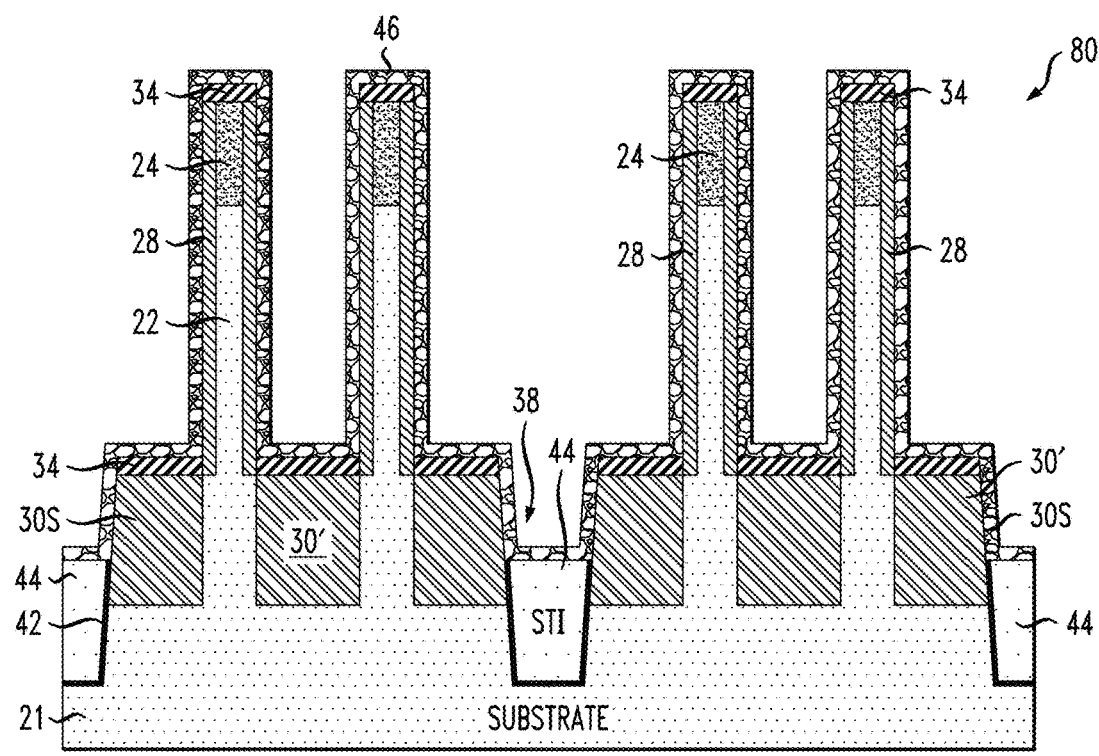
FIG. 8 is a sectional view showing the structure of FIG. 7 following conformal deposition of ring contact metal.

Bottom source/drain contact silicides are formed on the structure 70 using suitable metallization processes. In one or more embodiments, an electrically conductive metal such as nickel, nickel platinum, or titanium is conformally deposited on the structure 70. Electroless deposition processes and atomic layer deposition (ALD) are among the techniques that may be employed to form a structure 80 as schematically illustrated in FIG. 8. The deposited metal layer 46 adjoins the sidewalls 30S of the bottom source/drain regions 30' as well as other surfaces of the structure 80. Metal deposition may be followed by low temperature silicidation to form metal silicide or, in some alternative embodiments, metal germanosilicide layers on the vertically extending sidewalls 30S of the bottom source/drain regions 30'. Annealing temperatures between 300-420° C. form uniform layers of metal-rich silicides. Annealing could be performed using a laser spike anneal in the range of 700° C. to 1100° C. in some embodiments.

Figure 9:
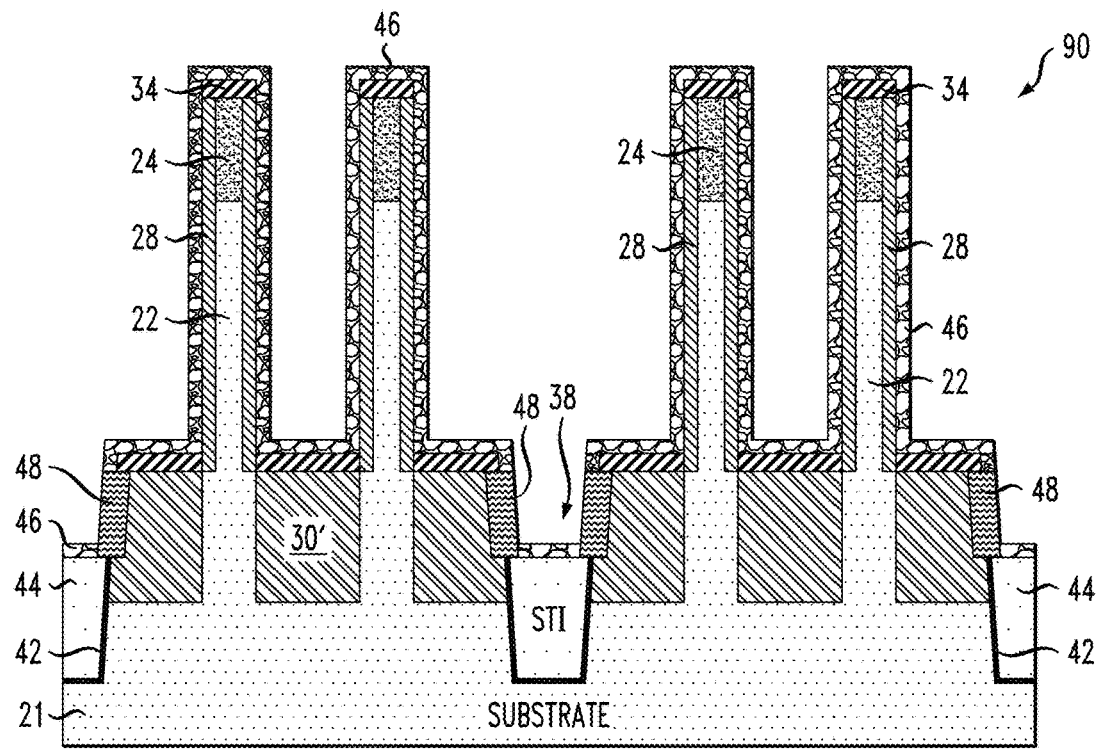
FIG. 9 is a sectional view showing the structure of FIG. 8 following formation of ring contact metal silicide from the source/drain regions and ring contact metal.

The metal silicide layer 48 forms ring-shaped elements that wrap around the vertically extending side walls of the active regions of the monolithic structure 90, as schematically illustrated in FIG. 9. The portions of the metal layer 46 adjoining portions of the structure 90 other than the source/drain regions 30' do not form metal silicides. It will be appreciated that each active region may, in some embodiments, include merged source/drain regions having only one conductivity type (n or p). In other exemplary embodiments, such as the active regions of SRAMs, adjoining bottom source/drain regions of, respectively, n-type and p-type conductivity are present.

Figure 10:
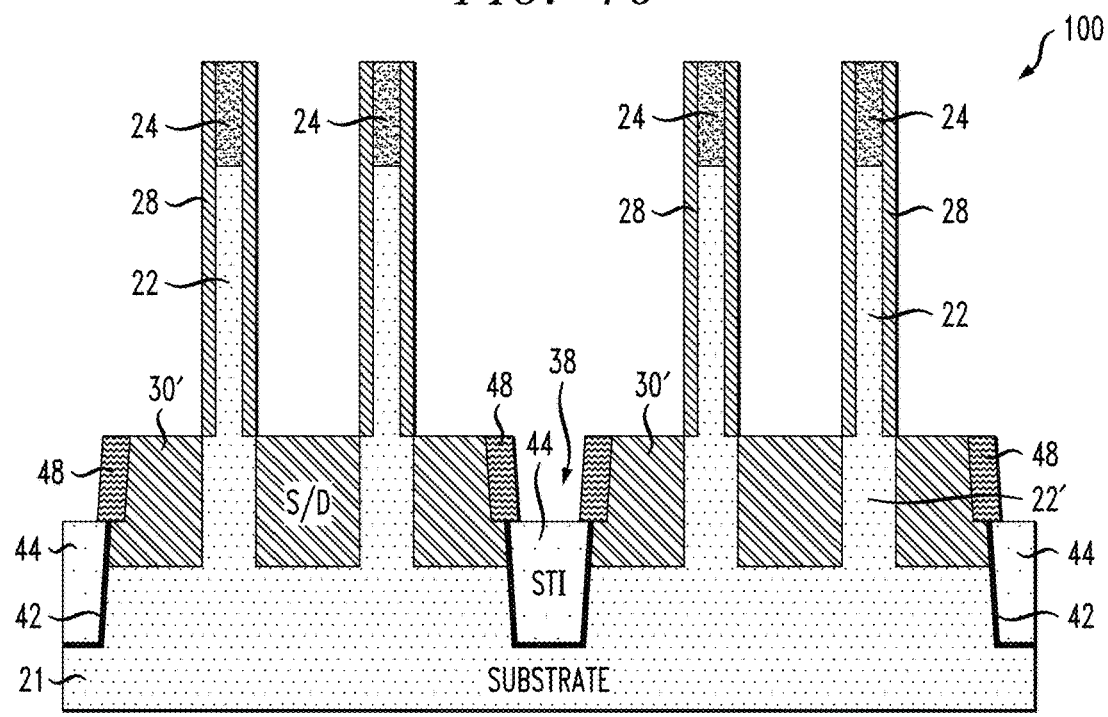
FIG. 10 is a sectional view showing the structure of FIG. 9 following selective removal of contact metal and liner material therefrom.

The unreacted contact metal 46 and the protective liner 34 on the top surface of the bottom source/drain regions 30' are selectively removed to obtain a structure 100 as schematically illustrated in FIG. 10. A selective wet chemical etching of the unreacted contact metal leaves the metal silicide essentially intact. In some exemplary embodiments, an aqueous solution containing sulfuric acid ($H_2SO_4$) and hydrogen peroxide ($H_2O_2$) can be used to remove unreacted metals without damaging silicides. Discrete rings 48 of metal silicide (and/or metal germanosilicide) extend around the merged, bottom source/drain regions 30', now forming the upper portions of the side walls of the active regions. The lower portions of the active region side walls, being beneath the top surface of the STI oxide layer 44, do not comprise metal silicide. The top ends of the ring-shaped metal silicide are substantially coplanar with the top surfaces of the bottom source/drain regions 30'. The bottom ends thereof adjoin the top surface of the STI oxide 44 and liner 42.

Figure 11:
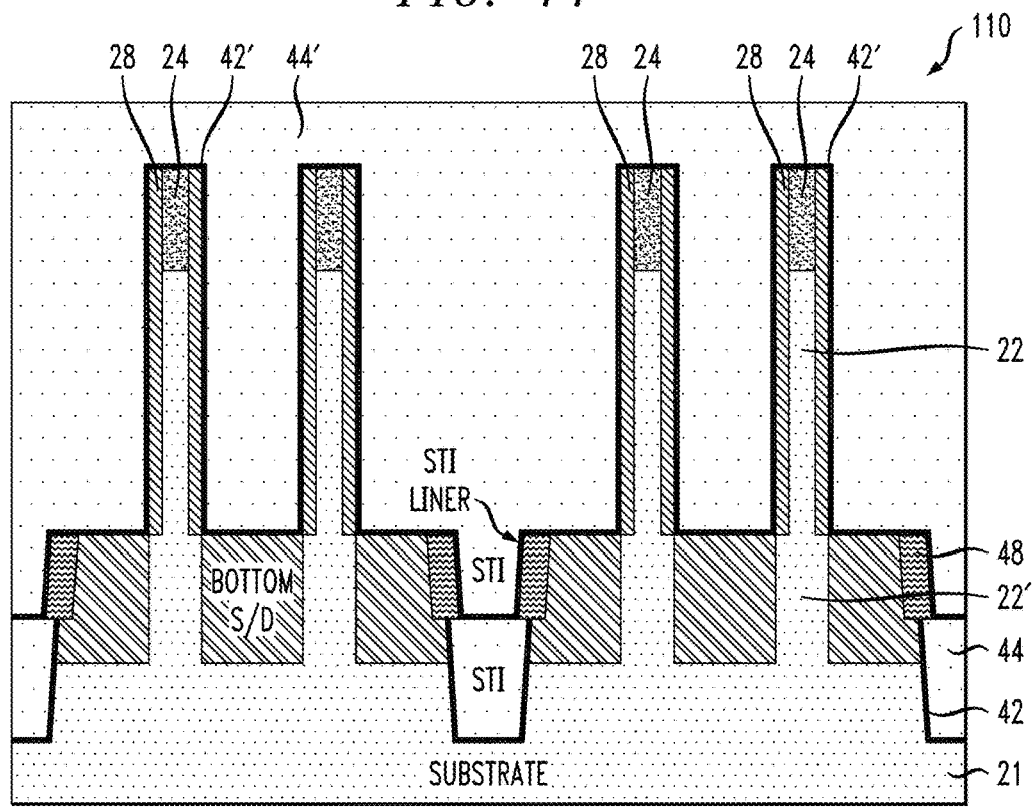
FIG. 11 is a sectional view showing the structure of FIG. 10 following conformal deposition of a further dielectric liner and a further dielectric fill layer.
Figure 12:
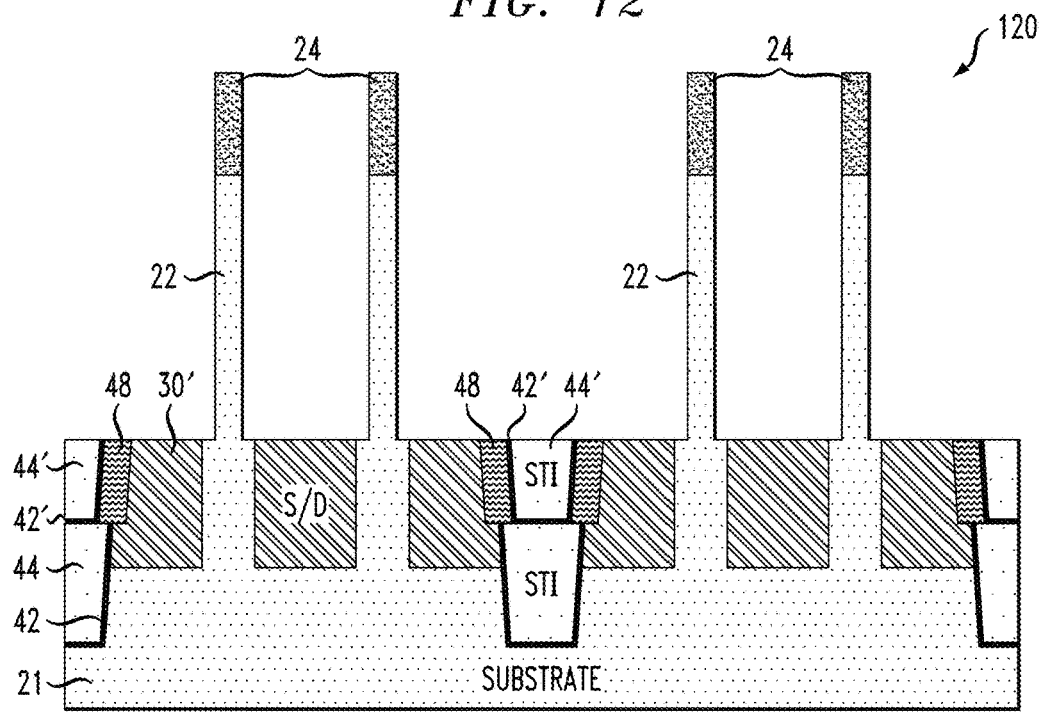
FIG. 12 is a sectional view showing the structure of FIG. 11 following recessing of the further dielectric fill layer and exposed portions of the further dielectric liner.

A second conformal STI liner 42' is formed over the structure followed by deposition of a second STI oxide fill layer 44'. As schematically illustrated in FIG. 11, the second STI liner 42' adjoins the metal silicide layer 48. The second STI liner and the second STI oxide fill layer may comprise the same materials as the first STI liner and oxide fill layer and be deposited using the same processes. Referring to FIG. 12, the second STI fill layer 44' is recessed down to the top surfaces of the bottom source/drain regions 30'. The exposed portions of the second STI liner 42' and the etch-resistant liner 28 that adjoins the fin and hard mask sidewalls are also removed. The top surfaces of the source/drain regions 30', the top ends of the metal silicide layers 48, and the side walls of the semiconductor fins 22 are thereby exposed. The STI regions, which comprise two layers of STI oxide and two STI liners 42, 42', electrically isolate the bottom source/drain regions 30' of the resulting structure 120.

Figure 13:
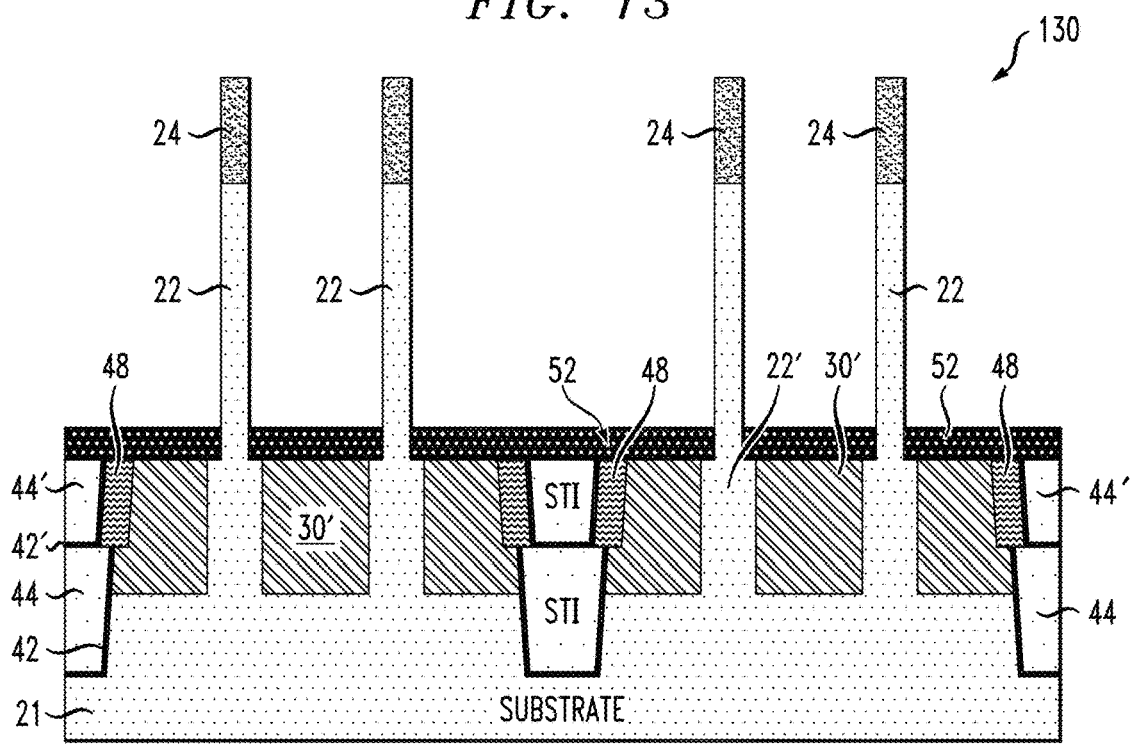
FIG. 13 is a sectional view showing the structure of FIG. 12 following bottom spacer formation.

A bottom spacer 52 is deposited over the bottom source/drain regions 30'. The bottom spacer 52 can be directionally deposited over the substrate by any non-conformal deposition methods that provide a faster deposition rate on the planar surface and slower deposition rate on the sidewall surfaces, including but not limited to plasma vapor deposition (PVD), gas cluster ion beam (GCIB) deposition and high density plasma (HDP) deposition. After directional deposition of bottom spacer material, an etch-back process can be performed to remove the any residue of spacer material from the fin side walls. In PVD, a pure source material is gasified via evaporation, the application of high-power electricity, laser ablation, or the like. The gasified material will then condense on the substrate material to create the desired layer. Other deposition methods may alternatively be employed, such as chemical vapor deposition (CVD), plasma enhanced CVD or atomic layer deposition (ALD). The bottom spacer 52 can include a dielectric material, such as, for example, SiN, SiC, SiOC, SiCN, BN, SiBN, SiBCN, SiOCN, $SiO_xN_y$, and combinations thereof. The bottom spacer may have a thickness of about three to about ten nanometers, though such a range is not considered critical. A monolithic structure 130 as schematically illustrated in FIG. 13 may be obtained. The bottom spacer 52 adjoins the top surfaces of the source/drain regions 30', the fin base portions 22' and the STI regions.

Figure 14:
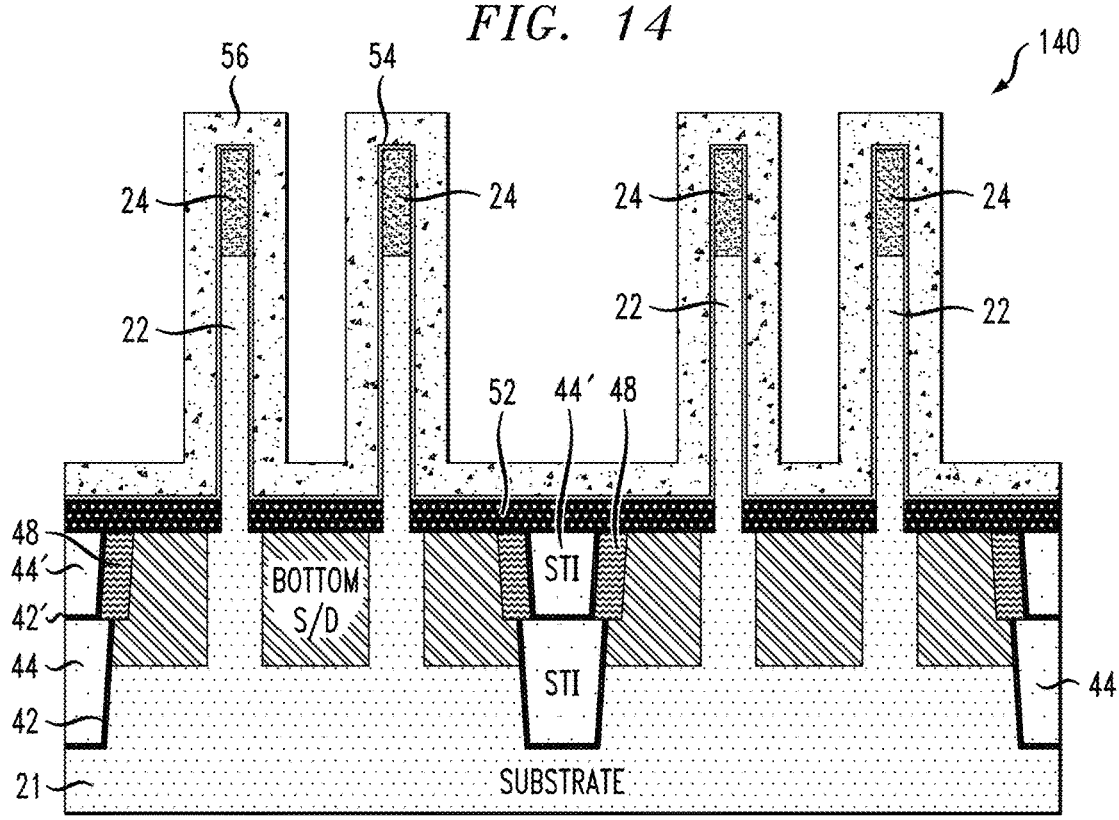
FIG. 14 is a sectional view showing the structure of FIG. 13 following gate stack formation thereon.

A gate dielectric layer 54 and work function metal (WFM) layers 56 are deposited conformally and sequentially to form gate stacks for the VTFET devices to be completed. As shown in FIG. 14, the gate dielectric layer 54 adjoins the sidewalls of the channel regions of the semiconductor fins 22 above the bottom spacer 52. Non-limiting examples of suitable materials for the gate dielectric layer include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer 54 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In some embodiments, the gate dielectric layer includes multiple layers.

Work function metal (WFM) layers are disposed over the gate dielectric layer in both the nFET and pFET regions (in embodiments having both types of regions) to complete the gate stacks. Non-limiting examples of suitable work function (gate) metals include p-type work function metal materials and n-type work function metal materials. P-type work function materials include compositions such as ruthenium, palladium, platinum, cobalt, nickel, and conductive metal nitride like TiN, WN, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

The work function metal(s) may be deposited by a suitable deposition process, for example, ALD, CVD, PECVD, PVD, plating, and thermal or e-beam evaporation. Pinch-off of work function metal material between semiconductor fins is essentially avoided during deposition. The WFM layer is removed from one of the nFET and pFET regions in structures including both types of regions while the other region is protected. An SC1 etch, an SC2 etch or other suitable etch processes can be employed to remove the selected portion of the originally deposited WFM layer. A new WFM layer suitable for the region is then deposited. A device formed in the nFET region will accordingly include a WFM layer (gate electrode) having a first composition while a device in the pFET region will have a WFM layer having a second composition. For example, the WFM employed in an nFET region may be a Ti, Al, TiAl, TiAlC or TiAlC layer or a metal stack such as TiN/TiAl/TiN, TiN/TiAlC/TiN, TiN/TaAlC/TiN, or any combination of an aluminum alloy and TiN layers. The WFM layer employed in the pFET region may, for example, be a TiN, TiC, TaN or a tungsten (W) layer. The threshold voltage (Vt) of nFET devices is sensitive to the thickness of work function metals such as titanium nitride (TiN).

Figure 15:
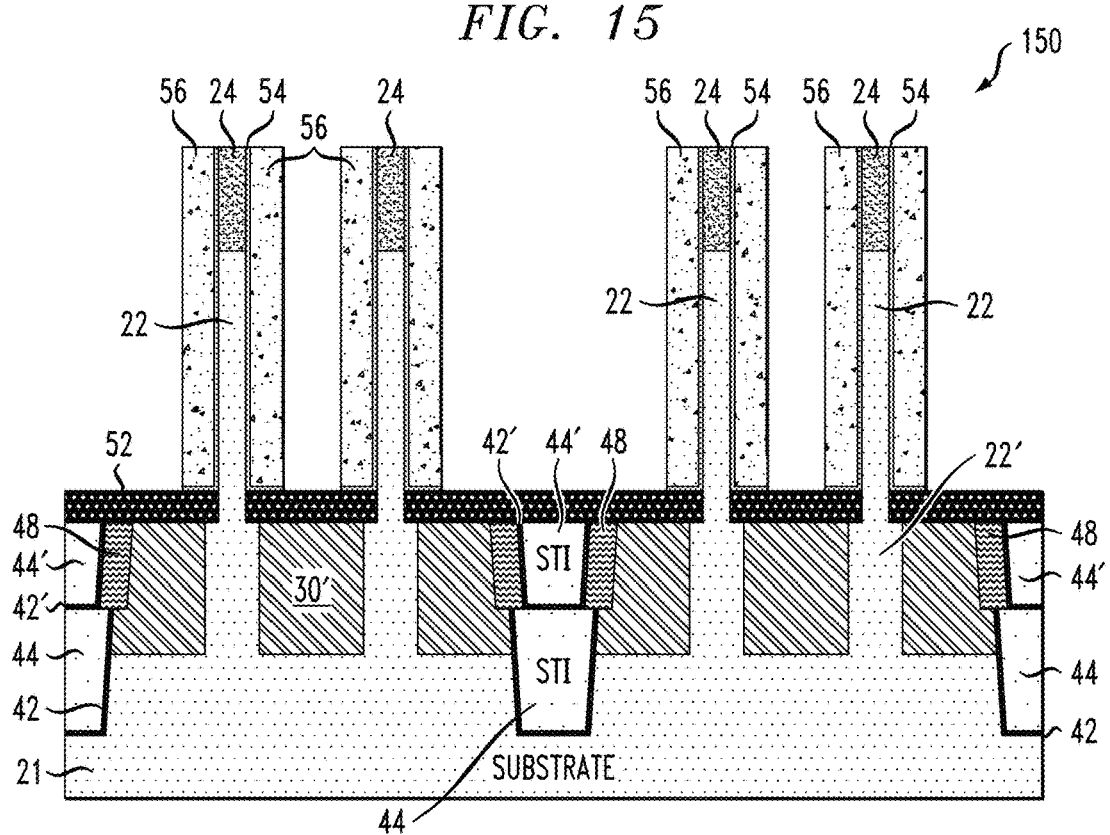
FIG. 15 is a sectional view showing the structure of FIG. 14 following a directional etch of the gate stacks.

Referring to FIG. 15, a directional etch of the gate stacks is performed to remove the gate stacks from horizontal surfaces. Upon completion of the directional etch, the gate stacks of the resulting structure 150 line the side walls of the semiconductor fins 22 and the dielectric caps 24 on the top surfaces of the semiconductor fins. The bottom portions of the gate stacks adjoin the bottom spacer 52.

Figure 16:
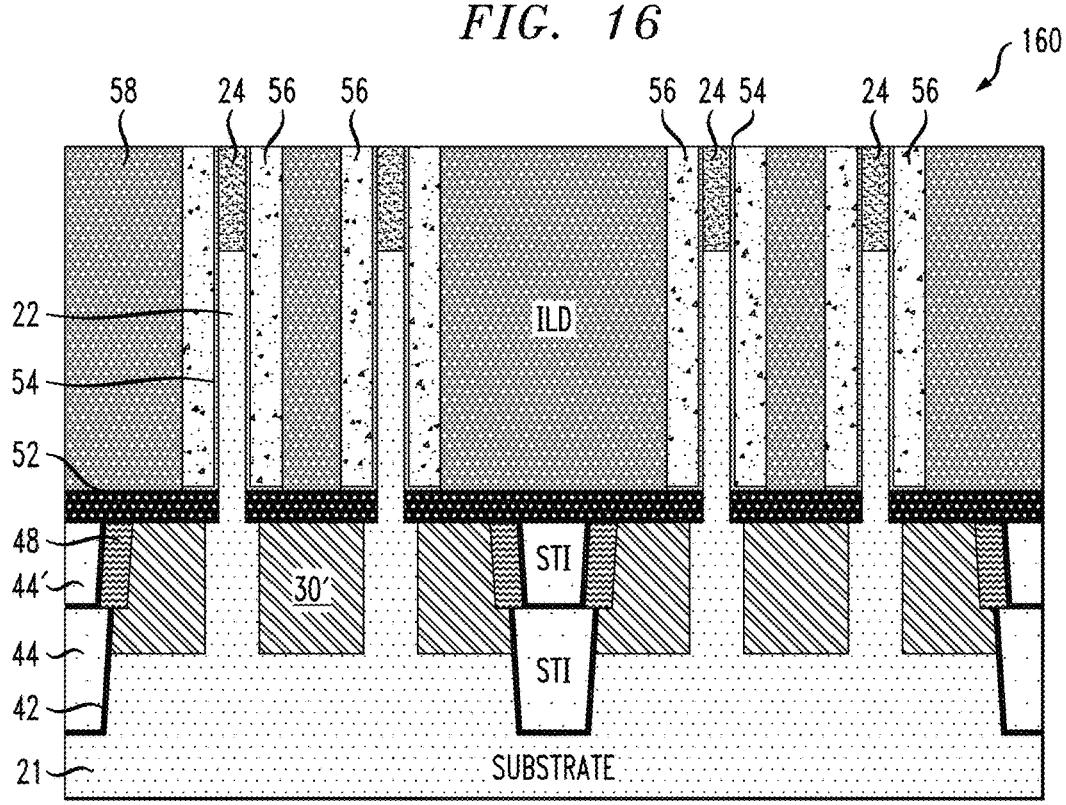
FIG. 16 is a sectional view showing the structure of FIG. 15 following deposition of an interlevel dielectric layer and planarization thereof.

An interlevel dielectric (ILD) layer 58 is deposited on the structure 150, thereby filling the spaces between the gate stacks adjoining the semiconductor fin side walls. The interlevel dielectric layer 58 may, for example, comprise a conformal oxide such as ALD silicon dioxide in one exemplary embodiment. Other dielectric materials may alternatively be employed in some embodiments, though etch selectivity between the ILD layer and the caps 24 should be provided. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process and preferably much greater. The interlevel dielectric layer is deposited by any suitable deposition process including but not limited to CVD, PVD, plasma-enhanced CVD, atomic layer deposition (ALD), evaporation, chemical solution deposition, or like processes. The ILD layer 58 is planarized down to the top surfaces of the dielectric caps (hard mask portions) 24 on the top ends of the semiconductor fins 22. A structure 160 as schematically illustrated in FIG. 16 is obtained following chemical mechanical planarization (CMP).

Figure 17:
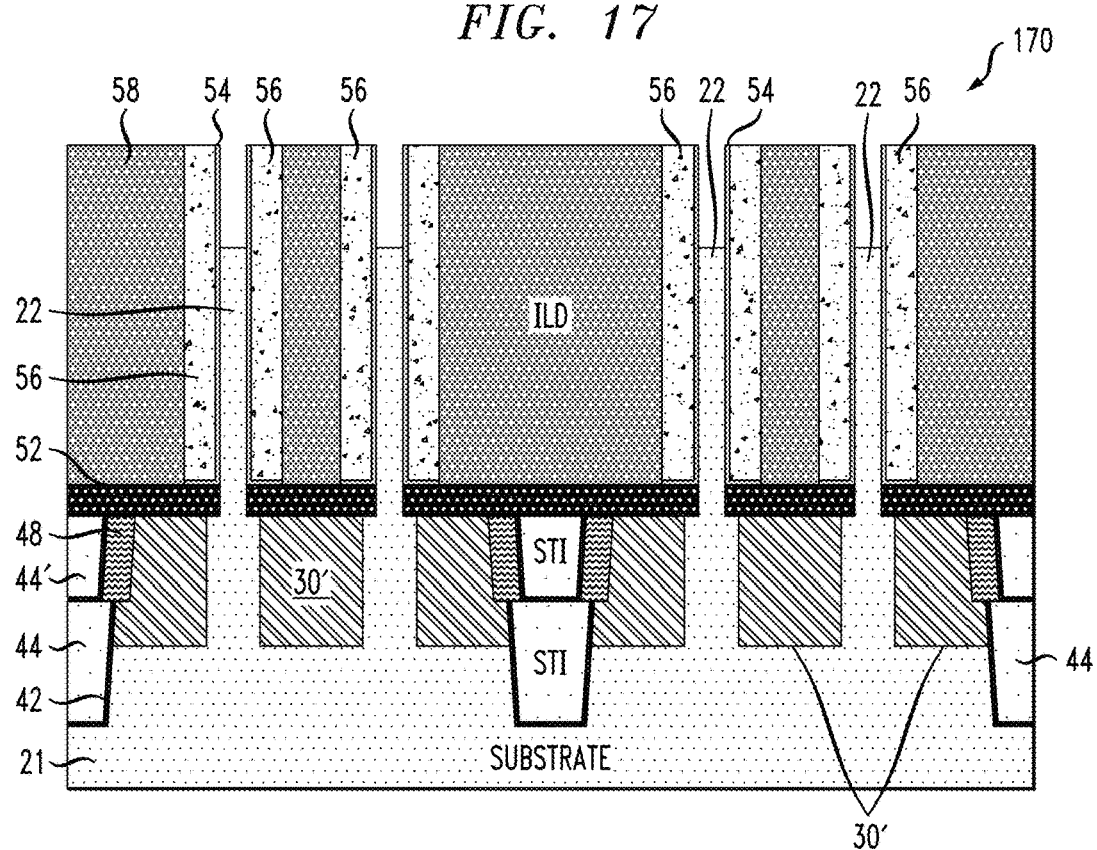
FIG. 17 is a sectional view showing the structure of FIG. 16 following selective removal of hard masks from the tops of the semiconductor fins.

The dielectric caps 24 on the semiconductor fins 22 are selectively removed to obtain a structure 170 as schematically shown in FIG. 17. In embodiments wherein a silicon nitride hard mask is employed, the dielectric caps 24 formed therefrom can be selectively removed using hot $H_3PO_4$ wet chemistry or other suitable process. The top surfaces of the semiconductor fins 22 are exposed following dielectric cap removal.

Figure 18:
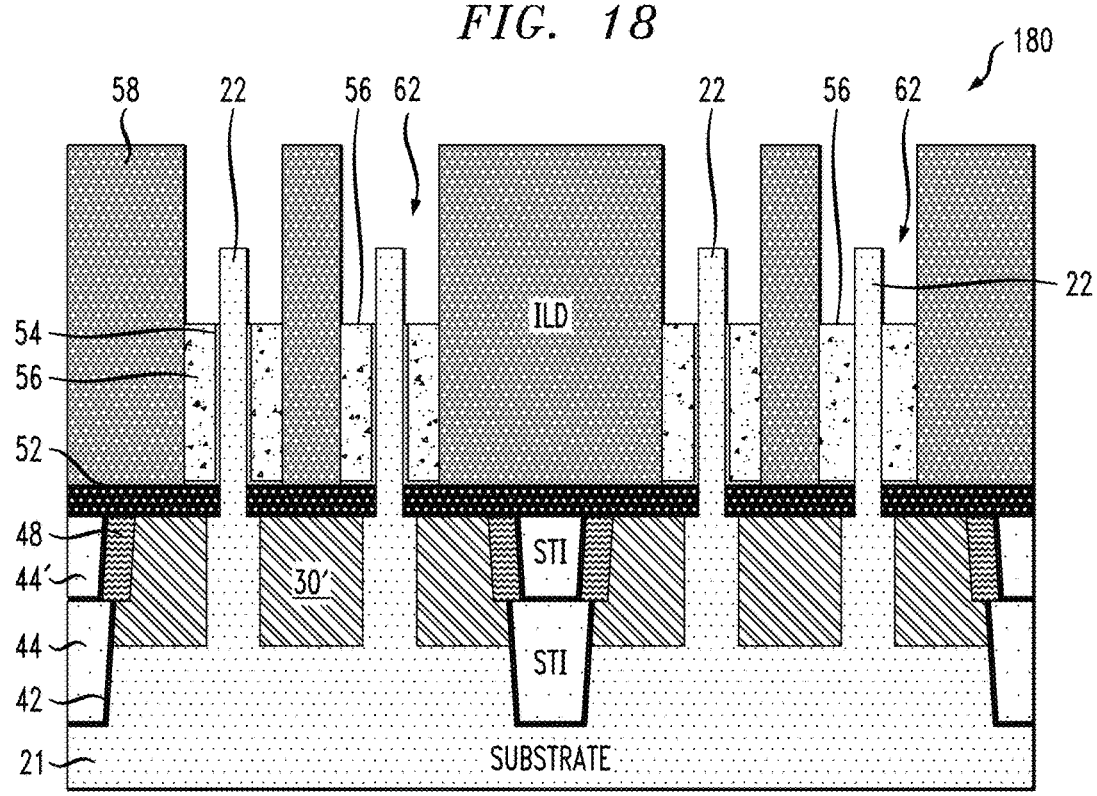
FIG. 18 is a sectional view showing the structure of FIG. 17 following selective etching of the gate stacks.

Removal of the dielectric caps 24 is followed by selective removal of portions of the gate stacks (54, 56). A timed, selective etch may be employed for recessing of the gate stacks, thereby setting the appropriate gate height. An etch process can be used to etch gate dielectric material and gate metal selective to other exposed materials in the structure 170, including the fin semiconductor material and the ILD material. The top surfaces and upper side wall regions of the semiconductor fins 22 are exposed after removal of the adjoining caps 24 and recessing of the gate stacks. The channel regions of the semiconductor fins 22 remain encapsulated by the remaining portions of the gate stacks of the resulting structure 180. The ILD layer 58 and the semiconductor fins 22 remain essentially intact during recessing of the gate stacks and the removal of the dielectric caps 24. Trenches 62 formed within the ILD layer 58 allow access the top portions of the semiconductor fins 22, as schematically illustrated in FIG. 18.

Figure 19A:
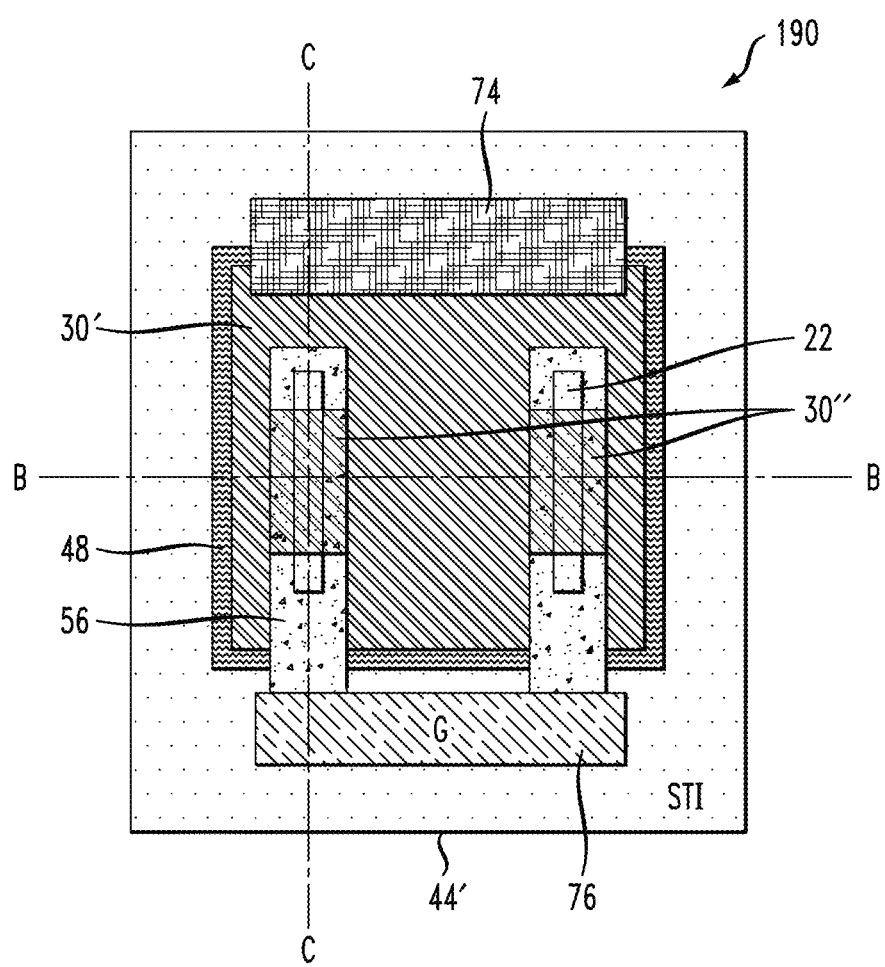
FIG. 19A is a top plan view showing completed VTFETs within a logic circuit.
Figure 19B:
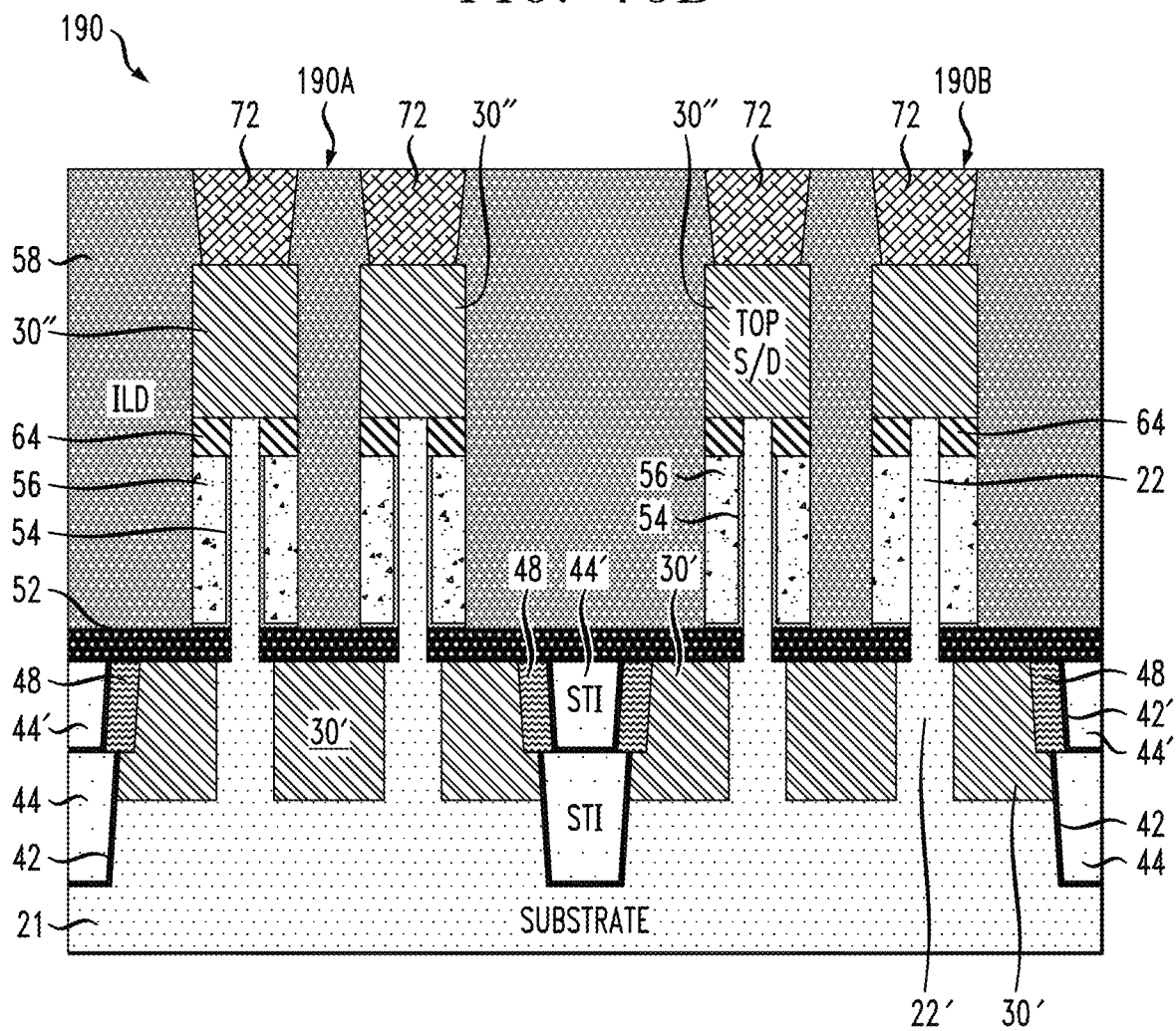
FIG. 19B is a sectional view taken along line B-B of FIG. 19A.
Figure 19C:
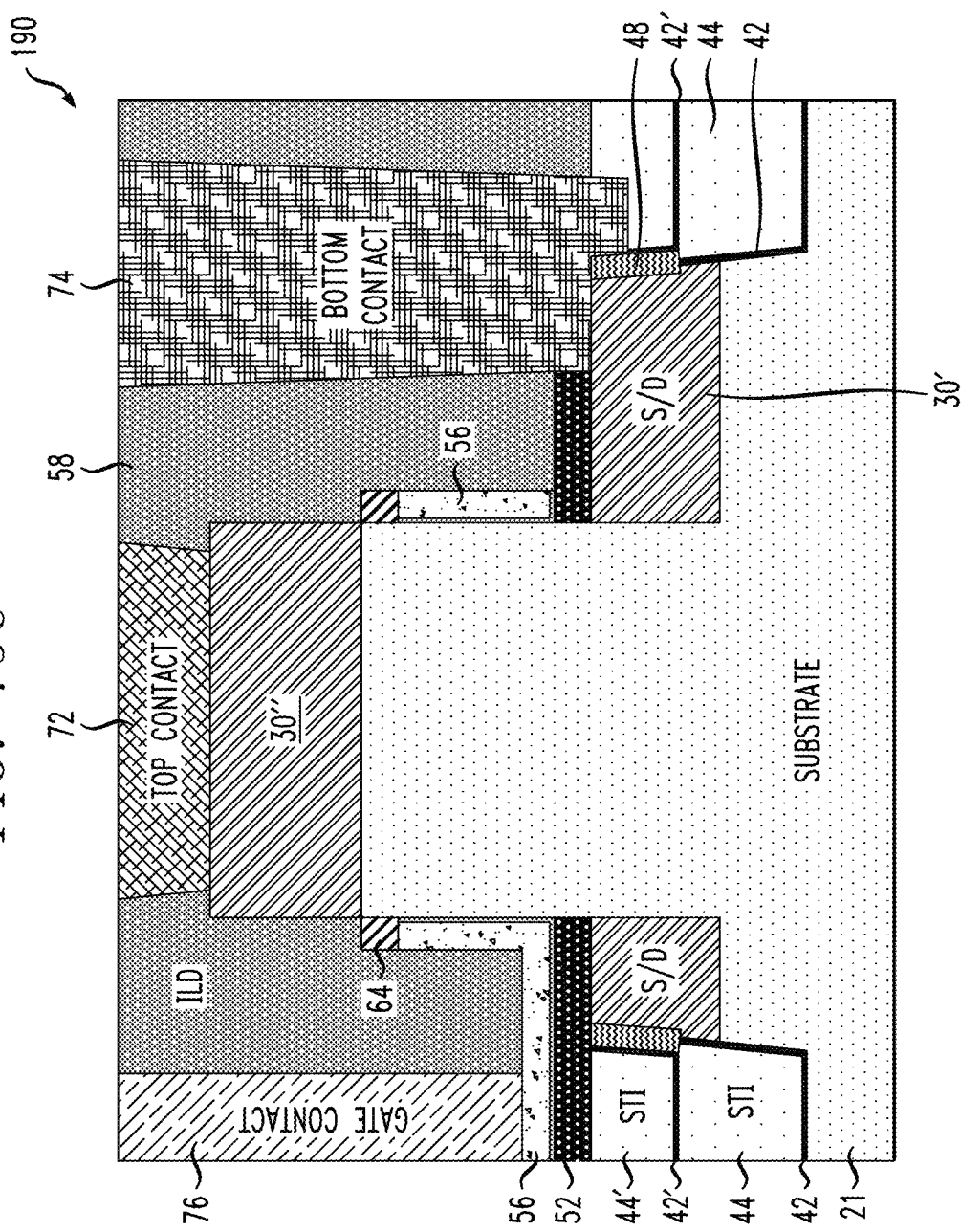
FIG. 19C is a sectional view taken along line C-C of FIG. 19A.

FIGS. 19A, 19B and 19C provide different views of exemplary VTFETs having ring-shaped, wrap-around metal silicide regions as employed in a logic circuit. Such VTFETs are obtained through continued processing of structures 180 as described above with respect to FIG. 18. Top spacers 64 as schematically illustrated in FIGS. 19B and 19C are formed within the trenches 62. The top spacers and bottom spacer comprise the same dielectric material(s) in some embodiments and the spacer material may be deposited using the same techniques. The top spacers 64 adjoin the upper side wall portions of the semiconductor fins 22 and the top surfaces of the gate stacks. At least the top surfaces of the semiconductor fins 22 are exposed following top spacer formation. Top spacer material above the top surfaces of the semiconductor fins and other horizontal surfaces can be removed using a reactive ion etch.

Top source/drain regions 30" are epitaxially grown on the exposed surfaces of the semiconductor fins 22. The processes and precursors for forming the top source/drain regions may be substantially the same as those employed in forming the bottom source/drain layer 30. Source/drain epitaxy occurs on at least the top surfaces of the semiconductor fins 22 and possibly portions of the fin side walls and within the recesses 62 formed in the ILD layer 58. In embodiments including nFET and pFET regions, source/drain regions having different conductivity types are formed in such regions.

Top source/drain contacts 72, bottom source/drain contacts 74 and gate contacts 76 are formed to obtain a structure 190 as exemplified in FIGS. 19A, 19B and 19C. (FIG. 19B includes VTFETs formed in two adjacent active regions whereas FIG. 19A shows only one of the active regions.) Trenches are formed in the ILD layer 58. Some trenches 62 extend down to the top surfaces of the top source/drain regions. Top source/drain contacts are formed using suitable metallization processes. In one or more embodiments, an electrically conductive metal such as nickel, nickel platinum, or titanium is deposited on the top source/drain regions. Electroless deposition processes and atomic layer deposition (ALD) are among the techniques that may be employed. Metal deposition may be followed by low temperature silicidation to form metal silicide or metal germanide layers (not shown) on the top source/drain regions. Annealing temperatures between 300-420° C. form uniform layers of metal-rich silicides. Annealing could be performed using a laser spike anneal in the range of 700° C. to 1100° C. in some embodiments.

A contact metal layer, for example tungsten (W) or cobalt (Co), is deposited on the structure, filling the trenches formed the ILD layer and directly contacting the metal silicide layers formed on the top source/drain regions. In some embodiments, the contact metal layer is a tungsten (W) layer that is deposited using a tungsten hexafluoride source with silane. Chemical vapor deposition conducted between 300-400° C. and using tungsten hexafluoride precursor chemistry may, for example, be employed to deposit a tungsten layer. Contact material may, for example, alternatively include tantalum (Ta), aluminum (Al), platinum (Pt), gold (Au), titanium (Ti), palladium (Pd) or any combination thereof. The contact material may be deposited by, for example, CVD, PECVD, PVD, plating, thermal or e-beam evaporation, or sputtering. A planarization process such as CMP is performed to remove any electrically conductive material (overburden) from the top surface of the structure. Gate and bottom source/drain contacts are also formed within the structure, as best shown in FIG. 19C. Similar techniques may be employed in depositing the contact metal for all contacts that are formed. As portions of the top surfaces of the bottom source/drain regions 30' are exposed prior to bottom contact formation, a silicide layer (not shown) may optionally be formed thereon as part of the bottom contact 74 formation.

As shown in one or more of the exemplary figures, the bottom source/drain conductors/contacts 74 extend from the top surface of the ILD layer to the top surfaces of the bottom source/drain regions. Such contacts 74 also adjoin portions of the top and side wall surfaces of the ring-shaped silicide (and/or germanosilicide) layer 48 that adjoins the exposed side walls of the active regions. The bottom contacts 74 extend only partially within the STI trenches, remaining above the horizontal portions of the STI liner 42'. The bottom contacts 74 can overlap the entire exposed sidewall of the silicide layer 48. The overlapping depth can be 50-100% of the sidewall of the silicide layer. As each active region can include multiple VTFETs, the formation of the silicide rings along the peripheries of the active regions as opposed to around individual VTFETs facilitates improvements in VTFET density. The top source/drain contacts 74 adjoin the top source/drain regions. The gate contacts 76 adjoin horizontally extending portions of the gate electrodes of VTFET transistors within the structure 190, as illustrated in FIG. 19C, and are electrically connected thereto.

As shown in the top plan view of FIG. 19A, the bottom epitaxy 30' for the exemplary structure 190 is merged. Accordingly, each device may comprise a plurality of fins and a single, common wrap-around silicide contact 48 on the edge (side wall) of the active area for the plurality of fins 22. It will be appreciated that there may be many fins in the channel and that the resulting device will have merged bottom epitaxy and a common silicide contact regardless of how many fins are present. Devices including such silicide contacts are electrically isolated from each other by STI regions. FIG. 19B, for example, shows two adjacent devices 190A, 190B, each including a plurality of fins 22, merged bottom epitaxy, and a wrap-around contact 48 on the peripheral side walls of the merged bottom epitaxy of each device. The two illustrated devices 190A, 190B within the structure 190 are electrically isolated by the STI regions 44, 44' therebetween.

An SRAM structure 200 may alternatively be formed with ring-shaped contacts using the processes discussed above. The ring-shaped silicide contacts 48 form self-aligned and reliable strapping for the n+ and p+ regions of the structure 200. Referring to the top plan view provided in FIG. 20A, the exemplary SRAM includes two active regions, each active region including both nFET and pFET transistors 30N, 30P. The exemplary structure further includes buried contacts 78 that are electrically connected to the ring-shaped, wrap-around silicide contacts 48. The silicide contacts 48 strap the bottom nFET and pFET source/drain regions, thereby providing more reliable electrical strapping than, for example, tunneling diodes formed by pn junctions. The buried contacts 78 connect the silicide contacts 48 to the SRAM inverters. (Each bit in an exemplary SRAM is stored on four transistors that form two cross-coupled inverters.)

Figure 20A:
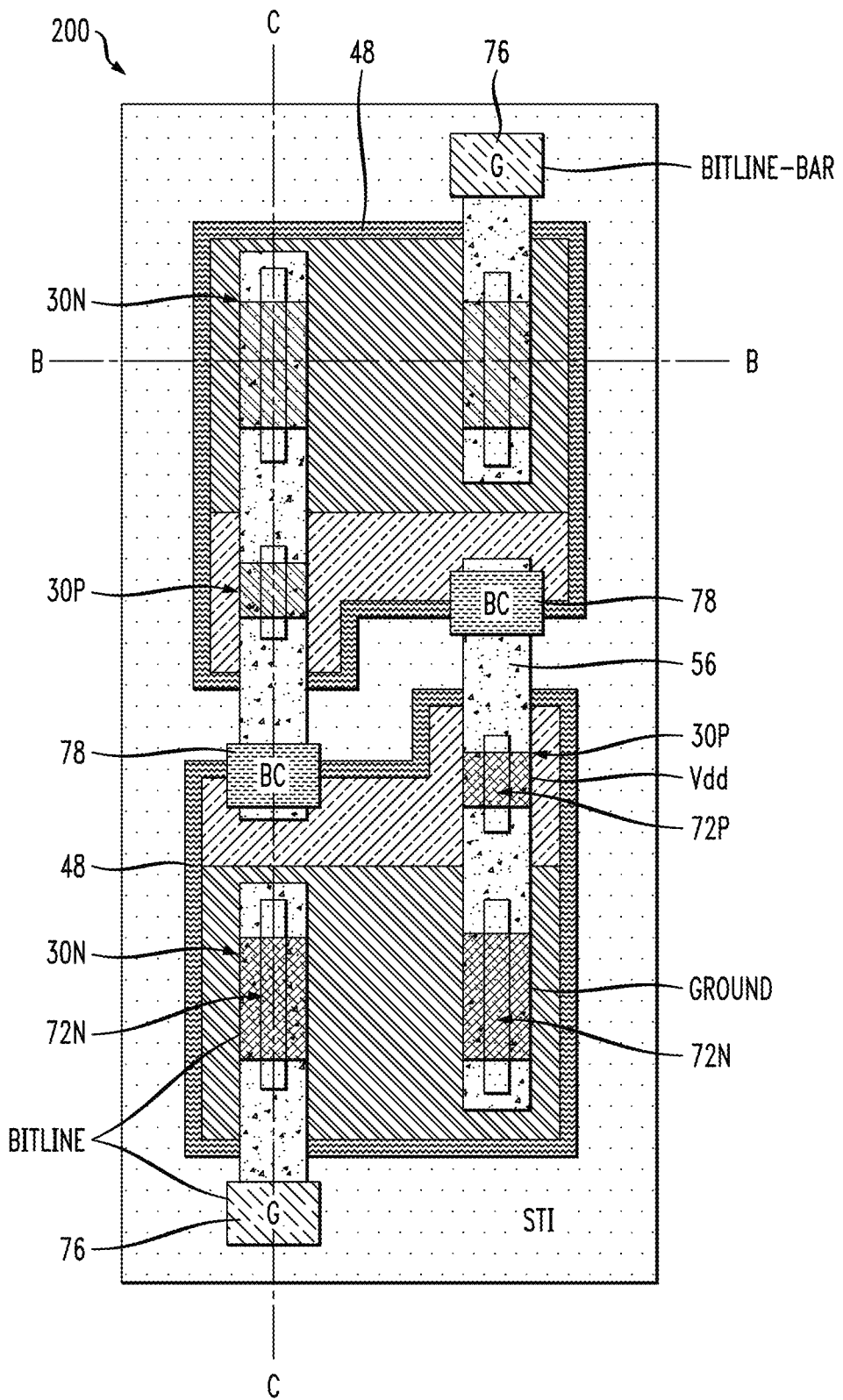
FIG. 20A is a top plan view of an exemplary SRAM including VTFETs.
Figure 20B:
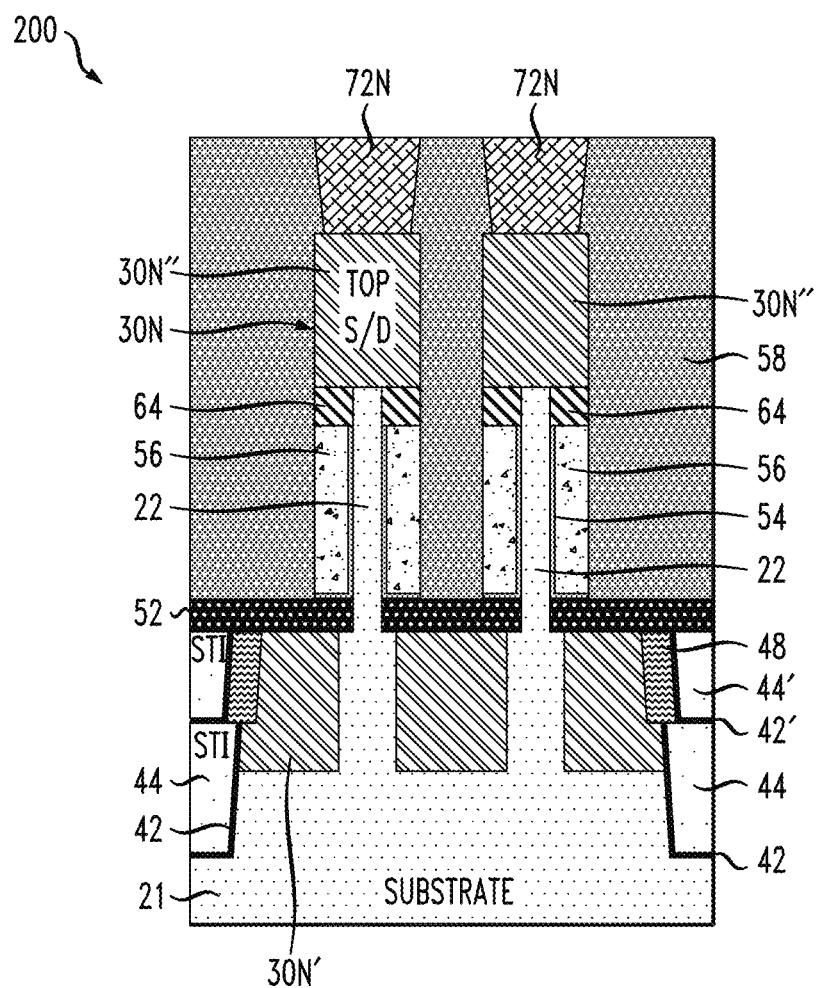
FIG. 20B is a sectional view taken along line B-B of FIG. 20A.

The exemplary SRAM structure 200 includes six VTFETs. Each active region includes two nFET transistors 30N and one pFET transistor 30P. Access transistors in the structure are connected to the bitline and bitline-bar, respectively. FIG. 20B is a sectional view illustrating two of the nFET transistors 30N within a region bounded by one of the ring-shaped, silicide contacts 48.

Figure 20C:
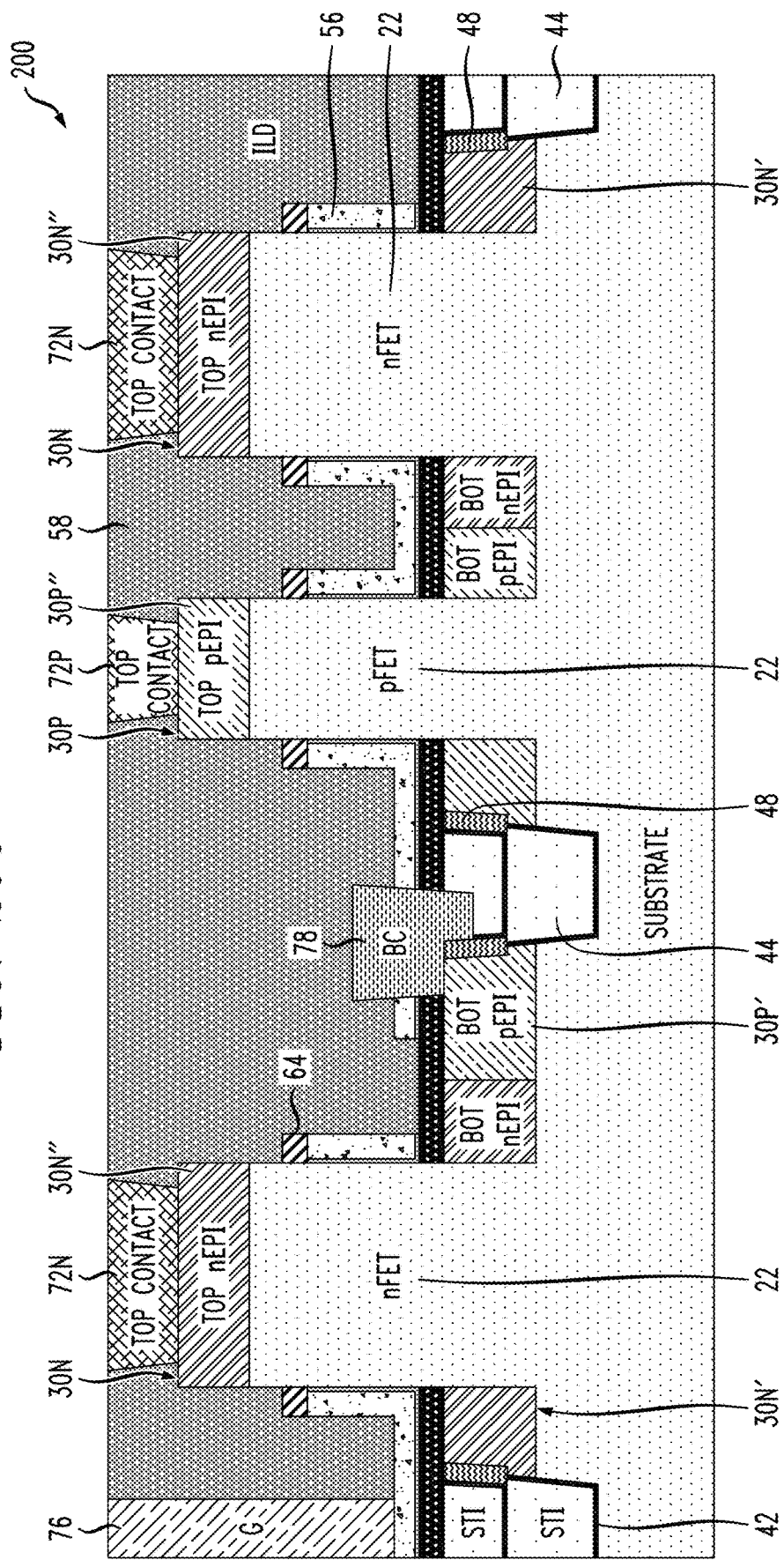
FIG. 20C is a sectional view taken along line C-C of FIG. 20A.

A further sectional view of the SRAM structure 200 is provided in FIG. 20C. Portions of the two adjoining active areas of the structure are shown. The active areas are separated by the STI region (elements 44, 44', 42, 42'). Each active region includes both n-type and p-type epitaxial source/drain regions 30N', 30P' that form elements of the nFET and pFET transistors 30N, 30P, respectively. Portions of the source/drain regions 30N', 30P' adjoin each other. The portions of the active regions employed to form pFET transistors may include silicon germanium source/drain regions while the source/drain regions of the nFET transistors are silicon. Ring-shaped silicide contacts 48 adjoin the side walls of the bottom source/drain regions and wrap around the active areas. The contacts 48 also adjoin STI liner 42' and dielectric material 44'. In the exemplary embodiment, the ring-shaped silicide contacts 48 extend, respectively, entirely around the active areas on which three vertical transistors are formed, two of which are nFETs and one of which is a pFET.

Referring again to FIG. 20C a buried contact 78 straps the ring contact silicide around one of the active areas with the gate of the inverter (shown to the right in the figure) in the other of the active areas. A horizontal portion of the gate electrode over the STI region facilitates the electrical connection of the buried contact with the inverter gate. The buried contact 78 can be formed at any appropriate stage of the process described above, for example following deposition of the ILD layer 58 as illustrated in FIG. 16. A mask (not shown) may be applied to allow vias to be formed by etching through the ILD layer, the gate layer, the bottom spacer and recessing into the STI region 44' to expose portions of the silicide contacts 48. Electrically conductive material or combinations of such material are deposited within the vias followed by planarization to remove excess electrically conductive material that may be deposited on the top surface of the ILD layer. The electrically conductive material is then recessed within the vias to a depth below the top surface of the ILD layer. Recessing depth is not considered to be critical so long as the top surface of the recessed material is above the top surface of the horizontally extending portions of the metal gate layer. Dielectric material is deposited within the vias, thereby filling them above the buried contacts 78. The buried contacts 78 alleviate potential wiring (routing) congestion, allowing other contacts or wires to be formed above the buried contacts without electrical shorting to them. Optionally, a silicide layer (not shown) is formed on top surfaces of the bottom epitaxial layer that are exposed following via formation and prior to contact metal deposition. A thin metal liner, such as a nickel or titanium liner having a thickness of about two nanometers, can be deposited on the exposed epitaxial layer and reacted therewith to form a metal silicide. The contact metal used to form the buried contacts 78 would then be electrically connected to the newly formed metal silicide as well as to the previously formed, self-aligned silicide rings 48 that are located only on the epitaxy side walls of the active regions and which provide reliable strapping for the n+ and p+ regions of the SRAM structure.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* $1^{st}$ Edition, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, an exemplary method of forming a structure including vertical transport field-effect transistors includes obtaining a semiconductor structure 70 including a substrate 21, a cavity 26 within the substrate, and parallel semiconductor fins 22 extending vertically from the substrate. The semiconductor structure further includes an active region including one or more doped, bottom source/drain regions 30' within the cavity, a protective liner 34 on the top surface of the active region, and a trench extending through the protective liner and into the substrate. A first layer 44 of STI dielectric material is within and partially fills the trench 38. An upper portion of the downwardly extending peripheral side wall of the active region adjoins the trench and extends vertically above the first layer of STI dielectric material 44. A contact metal layer 46 is deposited over the structure 70 and contacts the upper portion of the peripheral side wall 30S of the active region, as schematically illustrated in FIG. 8. A metal silicide layer 48 as shown in FIG. 9 is formed from the contact metal and the upper portion of the peripheral side wall of the active region and wraps around the active region. The protective liner is removed and gate stacks are formed on the semiconductor fins 22, as schematically illustrated in FIG. 14. Epitaxial top source/drain regions 30" are formed on the semiconductor fins 22, as shown for example in FIGS. 19B and 20B.

In some embodiments of the exemplary method, the semiconductor structure includes merged source/drain regions having the same conductivity type or different conductivity types. FIG. 20A illustrates and exemplary SRAM wherein the source/drain regions comprising each active region have opposite (n and p) conductivity types. In accordance with one or more further embodiments, an interlevel dielectric layer 58 is deposited above the active region, a side wall portion of the metal silicide layer adjoining the trench is exposed, and a metal contact is formed in electrical contact with the exposed side wall portion of the metal silicide layer and extending partially into the trench. FIG. 19C illustrates an exemplary metal contact 74 that may be employed in a logic circuit. FIG. 20C shows an alternative structure in which the metal contact 78 is buried within the ILD layer. In each case, the bottom metal contact extends within the STI trench and makes direct contact with the side wall of the silicide contact 48 that wraps around the active region.

Further given the above discussion, a method of forming a structure including vertical transport field-effect transistors in accordance with another aspect includes obtaining a semiconductor structure including a substrate 21, a cavity 26 within the substrate, and parallel semiconductor fins 22 extending vertically from the substrate, epitaxially forming an active region including merged bottom source/drain regions 30' within the cavity, the active region including a top surface and a peripheral side wall 30S extending downwardly from the top surface thereof, forming a metal silicide layer 48 on the peripheral side wall of the active region and wrapping around the active region, and forming a plurality of vertical transport field-effect transistors comprising the merged bottom source/drain regions, the semiconductor fins 22, gate stacks adjoining the semiconductor fins, and epitaxial top source/drain regions 30" adjoining the semiconductor fins. In a further aspect of the method, a trench 38 surrounding the active region is formed and filled with STI dielectric material 44. The STI dielectric material is recessed to a level beneath the top surface of the active region, thereby exposing an upper portion of the peripheral side wall of the active region. Formation of the metal silicide layer in accordance with the further aspect of the method includes conformally depositing a layer of contact metal 46 over the exposed upper portion of the peripheral side wall of the active region and forming the metal silicide layer 48 from the contact metal 46 and the exposed upper portion of the peripheral side wall of the active region by annealing. The exemplary method may further include depositing an interlevel dielectric layer 58 around the vertical transport field-effect transistors, exposing a side wall portion of the metal silicide layer 48 adjoining the trench, and forming a metal contact (74 or 78) in electrical contact with the exposed side wall portion of the metal silicide layer 48 and extending partially into the trench.

In accordance with further aspects of the invention, a semiconductor structure includes a semiconductor substrate 21, vertical transport field-effect transistors extending vertically with respect to the semiconductor substrate, and one or more active regions on the semiconductor substrate. each of the one or more active regions includes merged, bottom source/drain regions 30' for a plurality of the vertical transport field-effect transistors and a peripheral side wall extending downwardly from a top surface of the merged, bottom source/drain regions. The peripheral side wall comprises a metal silicide contact 48 that wraps around the merged bottom source/drain regions. Shallow trench isolation regions surround, respectively, each of the one or more active regions. In a further aspect, a metal contact extends within one of the shallow trench isolation regions and contacts the metal silicide contact. In one or more embodiments, the shallow trench isolation regions include a first dielectric liner 42 adjoining the substrate 21 and bottom portions of the peripheral side walls of the active regions, a first layer 44 of STI dielectric material within the first dielectric liner, a second dielectric liner 42' on a top surface of the first layer of STI dielectric material and adjoining the metal silicide contact 48, and a second layer 44' of STI dielectric material within the second dielectric liner.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having VTFETs therein and ring-shaped silicide contacts that wrap around the active regions thereof.

An integrated circuit in accordance with aspects of the present inventions can be employed in essentially any application and/or electronic system where merged bottom epitaxy and common wrap-around silicide contacts for VTFETs would be beneficial. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment (s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A semiconductor structure comprising:
   a semiconductor substrate;
   one or more active regions on the semiconductor substrate, each of the one or more active regions comprising:
      a plurality of vertical transport field-effect transistors extending vertically with respect to the semiconductor substrate;
      merged, bottom source/drain regions for the plurality of the vertical transport field-effect transistors; and
      a peripheral side wall extending downwardly from a top surface of the merged, bottom source/drain regions and comprising a metal silicide contact wrapping around the merged bottom source/drain regions; and
   shallow trench isolation regions surrounding, respectively, each of the one or more active regions and wherein the shallow trench isolation regions comprise:
      a first dielectric liner adjoining the substrate and bottom portions of the peripheral side walls of the active regions;
      a first layer of STI dielectric material within the first dielectric liner;
      a second dielectric liner on a top surface of the first layer of STI dielectric material and adjoining the metal silicide contact; and
      a second layer of STI dielectric material within the second dielectric liner.

2. The semiconductor structure of claim 1, further including a metal contact contacting the metal silicide contact.

3. The semiconductor structure of claim 2, wherein the metal contact adjoins a side wall surface of the metal silicide contact.

4. The semiconductor structure of claim 2, further including:
   an interlevel dielectric layer above the substrate and encasing portions of the vertical field-effect transistors; and wherein:
      the metal contact comprises a buried contact within the interlevel dielectric layer;
      the merged, bottom source/drain regions include a first source/drain region having n-type conductivity and a second source/drain region having p-type conductivity; and
      the buried contact electrically straps the metal silicide contact of a first active region with a gate of a vertical transport field-effect transistors of a second active region on the substrate.

5. The semiconductor structure of claim 1, further including:
   semiconductor fins extending from the semiconductor substrate and comprising channel regions of the vertical transport field-effect transistors;
   a bottom spacer over the merged, bottom source/drain regions;
   top spacers adjoining the semiconductor fins; and
   epitaxial top source/drain regions on the semiconductor fins and above the top spacers.

6. The semiconductor structure of claim 1, wherein:
   the one or more active regions include first and second active regions, each of the first and second active regions including merged, bottom source/drain regions having n-type and p-type conductivity, respectively, and vertically extending side walls;
   the vertical transport field-effect transistors include first and second sets of transistors, the first set of transistors comprising portions of the first active region and the second set of transistors comprising portions of the second active region, the first and second sets of transistors being configured as a static random access memory cell.

7. The semiconductor structure of claim 6, further including:
   an interlevel dielectric layer encasing portions of the first and second sets of transistors;

first and second buried contacts within the interlevel dielectric layer;

the first buried contact electrically strapping the metal silicide contact wrapped around the merged source/drain regions comprising the first active region with a gate of one of the second set of transistors, the first buried contact extending partially within one of the shallow trench isolation regions; and the second buried contact electrically strapping the metal silicide contact wrapped around the merged source/drain regions comprising the second active region with a gate of one of the first set of transistors, the second buried contact extending partially within the one of the shallow trench isolation regions.

* * * * *